United States Patent [19]
Tajiri et al.

[11] Patent Number: 5,946,359
[45] Date of Patent: Aug. 31, 1999

[54] PARAMETER MEASURING APPARATUS FOR DIGITAL QUADRATURE MODULATION SIGNALS

[75] Inventors: Shinsuke Tajiri, Gyoda; Juichi Nakada, Kumagaya; Kenji Nowara, Okegawa, all of Japan

[73] Assignee: Advantest Corporation, Tokyo, Japan

[21] Appl. No.: 08/825,502

[22] Filed: Mar. 31, 1997

[30] Foreign Application Priority Data

Apr. 1, 1996 [JP] Japan ................................. 8-078977

[51] Int. Cl.$^6$ .................................................. H03D 3/22
[52] U.S. Cl. ........................ 375/331; 375/332; 375/340; 329/304
[58] Field of Search ........................... 375/200, 206–210, 375/224, 226, 271, 279–281, 283, 284, 322, 324, 325, 328–332, 340, 342, 343; 370/241, 252, 320, 335, 342, 441, 479; 455/226.1; 364/571.01, 571.02, 572, 577, FOR 156, FOR 157, FOR 164, FOR 169; 329/304; 324/612, 620, 622, 76.39, 76.52, 76.55, 76.58, 76.68, 76.77, 76.78

[56] References Cited

U.S. PATENT DOCUMENTS

| 5,187,719 | 2/1993 | Birgenheier et al. | 375/226 |
|---|---|---|---|
| 5,206,886 | 4/1993 | Bingham | 375/344 |
| 5,590,158 | 12/1996 | Yamaguchi et al. | 375/331 |
| 5,732,105 | 3/1998 | Andren et al. | 375/226 |

OTHER PUBLICATIONS

Proakis, J.G., Digital Communications. New York: McGraw–Hill Book Company, pp. 333–334, 1989.

Primary Examiner—Amanda T. Le
Attorney, Agent, or Firm—Staas & Halsey, LLP

[57] ABSTRACT

An input quadrature modulation signal which is converted into a digital signal is converted into a complex baseband signal in a converter 7. A rough estimation of parameters of the signal is made in a rough signal correction unit 51. Using the estimates, the complex baseband signal is corrected. Utilizing a data detection of the corrected signal, a reference signal which corresponds to a transmitted signal is formed from the detected data in a generator 52. The reference signal and the corrected signal are used to estimate parameters in a fine parameter estimation unit 23.

17 Claims, 15 Drawing Sheets

PARAMETER MEASURING APPARATUS FOR DIGITAL QUADRATURE MODULATION SIGNALS

BACKGROUND OF THE INVENTION

Currently the digitalization of radio communication is in full scale progress. In the United States, Japan and Europe, digital cellular systems according to the TDMA scheme are in practical use based on regional requirements, and each system has its own standard. The standard includes specifications for the minimum performance of a transmitter used in a particular system or a method of evaluation therefor. A standard for the digital cellular system according to the CDMA scheme is being formulated in the TR 45.5 Subcommittee of TIA/EIA, sponsored by QUALCOMM Company, and the evaluation of the performance of the transmitters and the receivers are defined by the standards IS-98 and IS-97. The present invention is directed to a system for measuring parameters which are required in performing "waveform quality measurement" defined in the standards IS-98 and IS-97 as well as the waveform quality measurement of digital quadrature modulation signals such as PSK, FSK: QAM or the like. In particular, the invention relates to a system for measuring parameters such as carrier frequency error, carrier phase, clock (symbol) phase or timing by processing digital data that is obtained by down-converting an RF (radio frequency) transmitted signal to be measured using a spectrum analyzer, sampling it at an appropriate sampling rate, and quantizing samples with an A/D converter having a suitable number of bits.

An apparatus for measuring modulation accuracy for a digital cellular system according to the TDMA scheme such as NADC is already developed, and is disclosed, for example, in U.S. Pat. No. 5,187,719, issued Feb. 16, 1993, in particular, in FIG. 15 thereof. A general arrangement is shown in FIG. 1 where an RF signal to be measured from an input terminal $t_1$ is converted into an IF measuring signal having a frequency determined by a frequency converter 2 which utilizes a signal from a local oscillator 1, and is then passed through an analog low pass filter 3 in order to eliminate frequency components outside a frequency band of interest. An output from the filter is sampled and quantized in an A/D converter 4, and the resulting digital data is stored in a buffer memory 5. The IF signal stored in the buffer memory 5 is processed by a digital signal processor 6 to provide a final measure.

Referring to FIG. 2, the digital signal processor 6 includes a baseband signal converter 7 which converts the IF measuring signal from the memory 5 into a baseband measuring signal having a spectral content around zero frequency, which signal is then translated into a signal form which is appropriate to effecting a calculation of a desired item to be measured, by a baseband signal correction unit 8, which also generates a reference signal required in order to calculate a desired item to be measured. Finally, the desired item to be measured is processed in a desired item calculation unit 9 in accordance with a signal processing algorithm as described in the cited U.S. Patent, for example.

Referring to FIG. 3, which shows the detail of the signal processing, the IF measuring signal from a terminal 10 is branched, before it is fed to the baseband signal converter 7, into a clock phase estimation unit 71 where a clock (symbol synchronization) phase is estimated. On the basis of this estimated phase, the input IF signal is resampled in a resampler 72 using an interpolation technique. The resampled output is converted into a baseband measuring signal by the baseband signal converter 7. A portion of FIG. 3 which follows the baseband signal converter until the signal is input to a desired item calculation unit 79 corresponds to the signal correction unit 8 shown in FIG. 2.

The signal correction begins with a demodulation of transmitted data from the input baseband measuring signal which takes place in a data detector 73. At this end, a clock phase or symbol synchronizing phase is supplied from the clock phase estimation unit 71. The detection of transmitted data which takes place here corresponds to the so-called delayed detection, allowing such detection in the presence of a frequency error or a phase error since output signals from the converter 7 contain frequency and/or phase error which is occurring prior to the converter 7. Demodulated data which is output from the data detector 73 is used to specify a time position in a TDMA burst in a time reference extractor 74. Specifically, a predetermined data pattern (or sync word) is delivered at a specified time position within a burst, and accordingly, a time position can be specified by detecting the sync word. Demodulated data is then fed to a reference signal generator 76 which generates a reference signal. On the other hand, a correction of the baseband measuring signal is made in a signal correction unit 75, which utilizes the baseband measuring signal and the reference signal from the generator 76 to perform the following operations:

1. parameters such as frequency error, phase error or the like (hereafter collectively referred to as transmission parameters) contained in the baseband measuring signal are estimated;
2. these estimated transmission parameters are used in forming a coherent complex sinusoidal wave, which is multiplied by the baseband measuring signal; and
3. IQ origin offset is estimated and subtracted from the complex sinusoidal signal formed.

A correction of the baseband measuring signal takes place in a manner mentioned above. The corrected measuring signal is filtered by a root Nyquist filter 78 to provide a signal waveform from which a inter-symbol-interference is removed. Subsequently, the signal is input to the signal correction unit 75 where the processing operations mentioned under the sub-paragraphs 1 to 3 are repeated. Thus, a correction of the signal by the signal correction unit 75 is repeated several times, and is completed when a variation is reduced below a predetermined threshold value. Finally, the corrected measuring signal is fed to a desired item calculation unit 79. However, in the prior art, it happened that the repetition fails to converge. What is mentioned is an example of measuring a modulation accuracy of the prior art, as exemplified by the cited patent. This algorithm premises a modulation scheme of π/4 DQPSK, and is inapplicable to OQPSK (offset QPSK) signal. To illustrate, the measuring signal is squared in the clock signal estimation unit 71, and is then filtered using a bandpass filter having a narrow passband which is centered about the symbol clock frequency, and clock phase is determined from the phase of a clock frequency component which is contained in the filtered output. A peak in the line spectrum of the symbol frequency components does exist in the squared IF signal for the π/4 DQPSK or QPSK signal, but such peak does not exist in the OQPSK signal, and hence the described technique is inapplicable. In addition, for OQPSK signal, a data demodulation according to the delayed detection is prohibited due to the presence of a crosstalk between I and Q. On the other hand, a data demodulation according to the delayed detection is possible with π/4 DQPSK or QPSK signal. Additionally, it happens in the prior art that the processing operations mentioned under the subparagraph 1–3 must be repeated many times in some instance, resulting in an increased computational complexity and an increased length of time.

According to the prior art, data demodulation and estimation of transmission parameters are prohibited without a modulation scheme which satisfies the requirements: a) delayed detection is possible and b) an estimation of a clock phase is possible without using transmitted data. Taking an example of OQPSK modulation signal, for example, it does not satisfy these requirements, and accordingly, with a conventional measuring algorithm, a waveform quality measurement is prohibited.

It is an object of the invention to provide a measuring apparatus which enables a data demodulation (or data detection) and an estimation of transmission parameters for a modulation signal from a digital equipment which does not satisfy the requirements mentioned above.

For a modulation scheme which does not permit a delayed detection, a data demodulation must be achieved through a synchronous detection. In the synchronous detection, it is required that a carrier frequency and a carrier phase of a received signal (or measuring signal) be known. On the other hand, an estimation of a carrier phase as one of transmission parameters requires demodulated data. Thus, with prior art, an estimation of transmission parameters which accommodates for any modulation scheme has been difficult.

SUMMARY OF THE INVENTION

A general arrangement of the present invention is summarized in FIG. 4 where an input quadrature modulating signal which is converted into a digital signal, i.e., a signal from the buffer memory 5 shown in FIG. 1, for example, is converted into a complex baseband signal in the baseband signal converter 7. A rough estimation of transmission parameters is made from the complex baseband signal by a rough signal correction unit 51 shown in FIG. 4, and the estimate is used to correct the complex baseband signal. The corrected complex baseband signal is passed through a receiving filter 57, as required, and is then fed to a data detector 54 and a fine parameter estimation unit 23. The data detector 54 detects data, which is in turn fed through a time axis extractor 53 to a reference signal generator 52. The generator 52 generates a reference signal which corresponds to the transmitted signal corresponding to the detected data. The reference signal is fed through a receiving filter 56, as required, to the fine parameter estimation unit 23. Parameters such as a frequency error, a carrier phase, a clock phase of the input signal or the like are estimated on the basis of the reference signal and the corrected baseband signal in the fine parameter estimation unit 23. If required, the complex baseband signal which is again corrected using such parameters may be fed to a fine signal correction unit 55 for a further correction, whereupon the signal is fed to the desired item calculation unit 9.

The rough signal correction unit 51 performs a rough signal correction, which then enables a data demodulation according to the synchronous detection, and the demodulated data may be used to perform an estimation of transmission parameters again, thus enabling an estimation with an improved accuracy of estimation. It is a simple matter to add any desired option for an individual measurement application to the arrangement mentioned above. For example, in the measurement of a modulation accuracy under IS-54B, a filtering by a receiving filter (a root Nyquist filter) is needed. However, this need can be met by disposing the receiving filters 57, 56 immediately following the rough signal correction unit 51 and the reference signal generator 52. The receiving filter 56 may be incorporated into the reference signal generator 52 with a better efficiency.

DETAILED DESCRIPTION OF PREFERRED EMBODIMENTS

Figure 5:
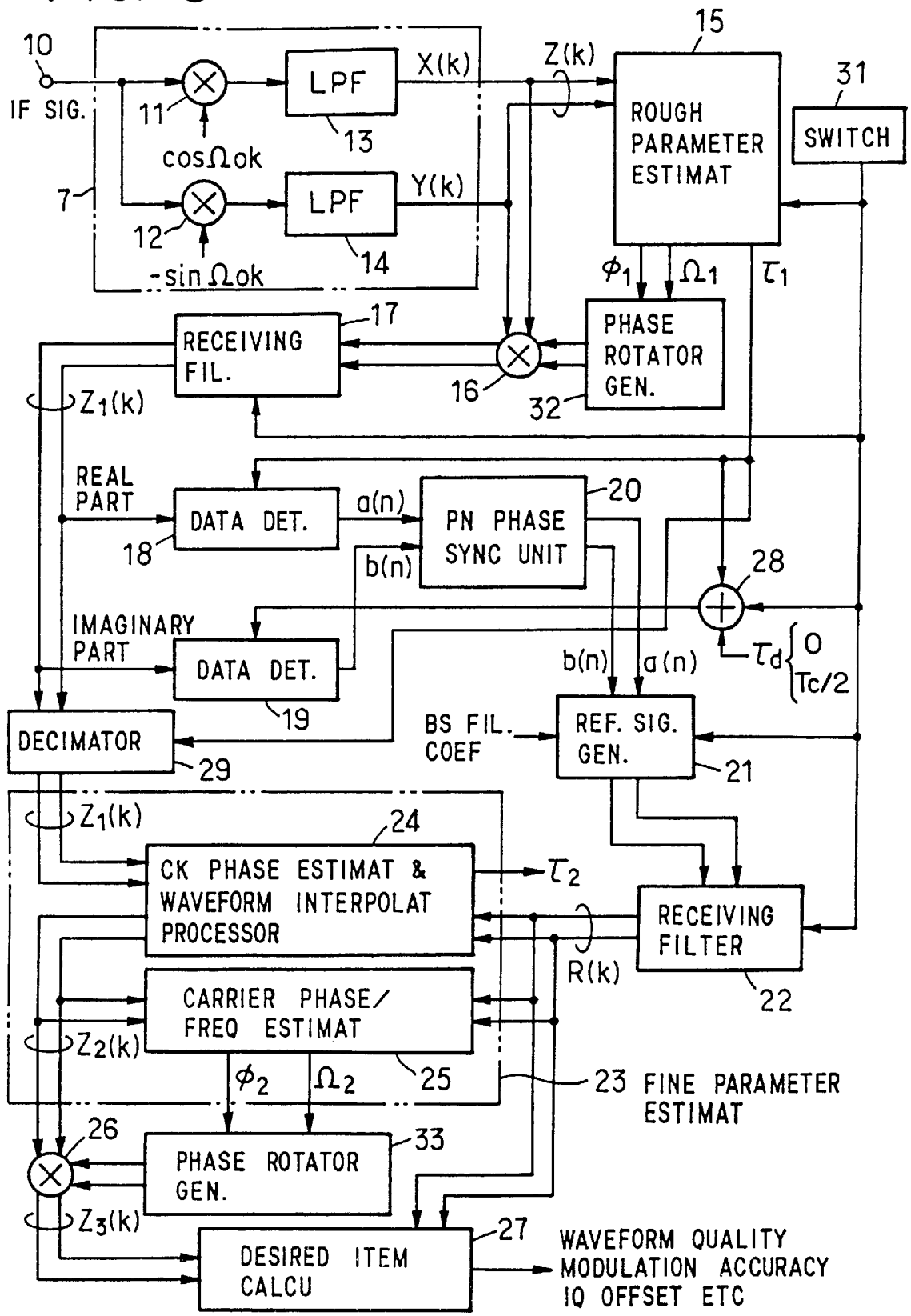
FIG. 5 is a block diagram of an embodiment of the invention, representing each function by a block.

FIG. 5 shows an embodiment of the invention. This embodiment enables a waveform quality measurement of a transmitter according to CDMA scheme, manufactured by QUALCOMM Company, which employs OQPSK and QPSK schemes as modulation schemes in an up-channel and a down-channel, respectively. The present embodiment is adaptable to either OQPSK or QPSK modulation scheme by a turn-on/-off switch operation. In the CDMA system of QUALCOMM Company, a symbol rate in the digital modulation is chosen equal to a chip rate in the spread code. Accordingly, in the description of this embodiment which follows, the symbol rate will be referred to as chip rate. The frequency of a chip rate is denoted by $f_c$ and the frequency of a sampling rate by $f_s$. In the present embodiment, a sampling rate of the converter is chosen to be eight times the chip rate, or, $f_s = R \cdot f_c$, R=8. Hereafter, R will be referred to as an oversampling rate.

General Arrangement and Flow of Processing

Figure 1:
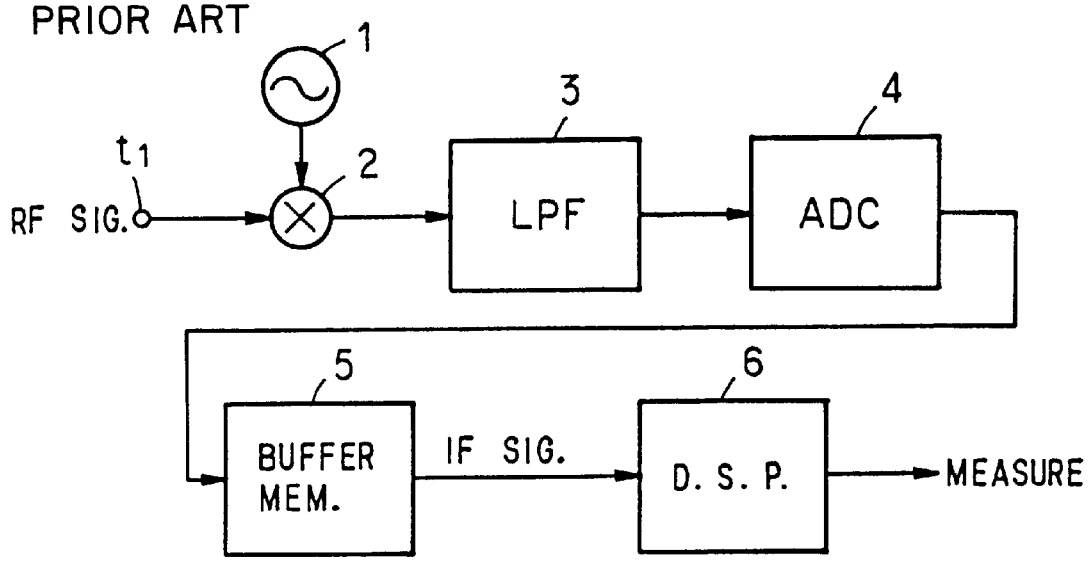
FIG. 1 is a block diagram of a general arrangement for the measurement of parameters.
Figure 2:
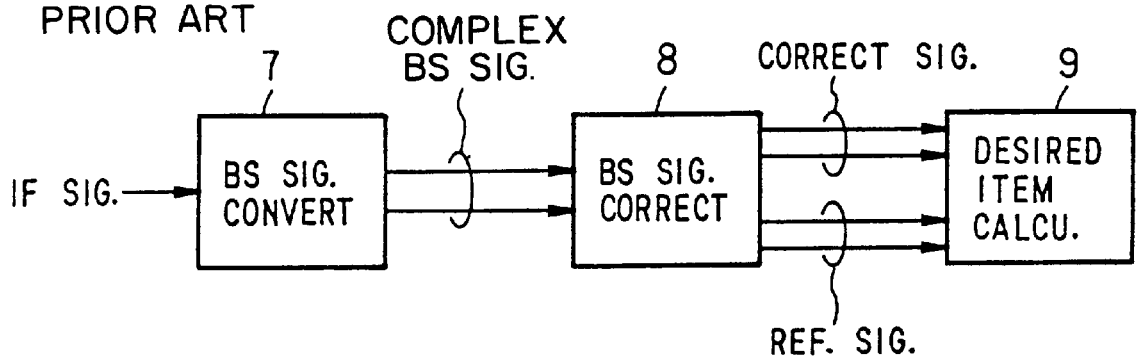
FIG. 2 is a block diagram of a general arrangement of a digital signal processor 6 shown in FIG. 1.
Figure 3:
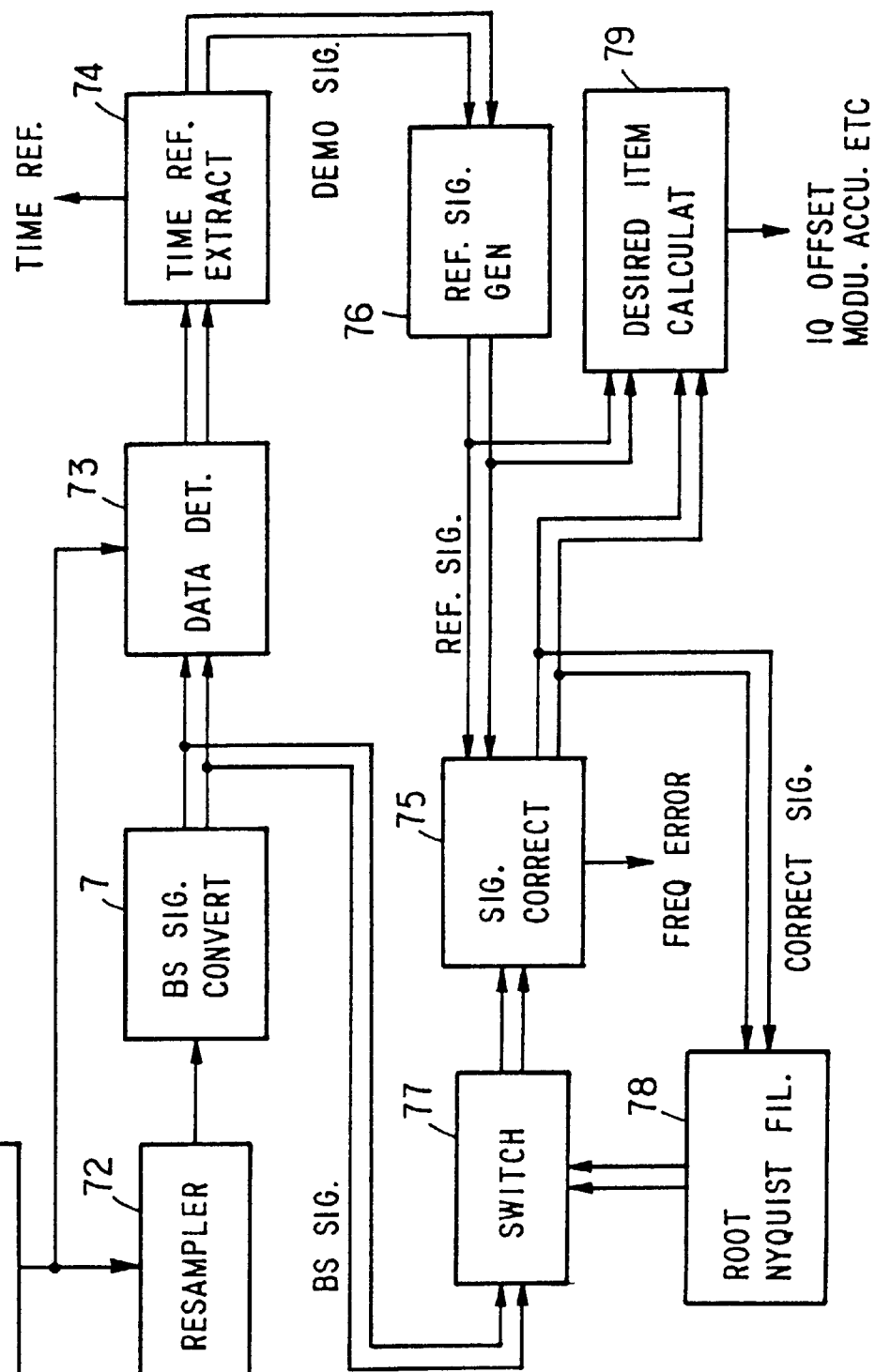
FIG. 3 is a block diagram of a conventional parameter measuring apparatus.

An IF signal from an input terminal 10 represents signal data which is stored in the buffer memory 5 shown in FIG. 1, and a k-th element of the data is denoted as r(k). Multipliers 11, 12 multiply the input IF signal by $\cos(\Omega_0 k)$, $-\sin(\Omega_0 k)$, respectively. The multiplied outputs are passed through low pass filters 13, 14 to obtain an in-phase component X(k) and a quadrature component Y(k). The in-phase component X(k) and the quadrature component Y(k) are expressed by the following equations:

$$X(k) = \sum_{m=-M}^{M} r(k-m)\cos(\Omega_0(k-m))u(m) \tag{1}$$

$$Y(k) = -\sum_{m=-M}^{M} r(k-m)\sin(\Omega_0(k-m))u(m) \tag{2}$$

As will be apparent from the above equations, each of the lowpass filters 13, 14 is implemented by an FIR filter having a tap coefficient length of 2M+1 and having the same characteristic u(k). In the above equations, $\Omega_0$ represents a phase variation per sample (radian/sample) corresponding to the center frequency $f_0$ of the input IF signal, and is related to $f_0$ by the following equation:

$$\Omega_0 = 2\pi f_0 T_s,$$

where $T_s = 1/f_s$.

A complex value signal Z(k) is defined here including X(k) as a real part and Y(k) as an imaginary part, and is referred to as a baseband signal.

In accordance with the invention, the baseband signal Z(k) is fed to a rough parameter estimation unit 15 where a rough estimation of transmission parameters contained in the baseband signal Z(k), that is, a phase variation per sample $\Omega_1$, a carrier phase $\phi_1$ and a clock (symbol) phase $\tau 1$ is made. To allow the rough parameter estimation unit 15 to accommodate for the both QPSK and OQPSK modulation signals, an internal switching operation takes place by means of a switch 31. $\Omega_1$ and $\phi_1$ which are estimated are used in a phase rotator generator 32 to calculate a complex sinusoidal wave $\exp[j(\phi_1 + \Omega_1 k)]$ which is then fed to a complex multiplier 16 where it is subject to a complex multiplication with the baseband signal Z(k), thus correcting the carrier phase with respect to the baseband signal. The corrected signal $Z_1(k)$ can be expressed by the following equation:

$$Z_1(k) = Z(k) \cdot \exp[j(\phi_1 + \Omega_1 k)] \tag{3}$$

Figure 6:
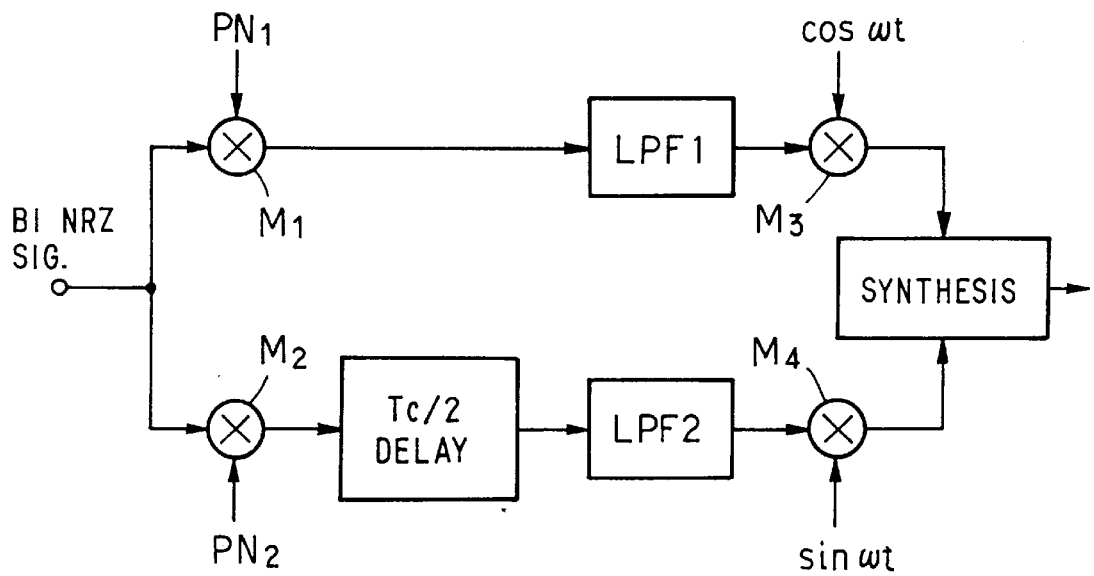
FIG. 6 is a block diagram of one form of OQPSK modulation signal generating means.

The corrected signal $Z_1(k)$ is fed through a complementary filter 17, which is a receiving filter, to data detectors 18, 19 and a decimator 29. The complementary filter 17 is turned on and off by the switch 31, and this switching operation is interlocked with a switching operation of the rough parameter estimation unit 15, the reference signal generator 21 and an adder 28, which operation is required in the CDMA system of QUALCOMM Company because a down-channel employs QPSK modulation while an up-channel employs OQPSK modulation and because the use of the complementary filter 17 is not required in the waveform quality measurement of the up-channel even though the use of the complementary filter 17 is required for the waveform quality measurement of the down-channel. Since the insertion of a complementary filter into a CDMA receiver according to the QPSK modulation scheme is required by the standard, complementary filters 17, 22 are used in measuring the QPSK signal. In the description to follow, the waveform quality measurement for the up-channel will be described, but this description also applies to the waveform quality measurement of the down-channel. On the transmitting side of the CDMA according to QUALCOMM Company, a bipolar NRZ signal is multiplied by a first and a second spread code PN1, PN2 having the same chip (clock) period as the symbol period in multipliers $M_1$, $M_2$, respectively, as shown in FIG. 6 and the multiplied outputs are fed through low-pass filters $LPF_1$, $LPF_2$, respectively, with one of the outputs being delayed by one-half the chip period or $T_c/2$ (where $T_c = 1/f_c$) by means of delay means, and they are further multiplied by a cosine carrier signal $\cos \omega t$ and a sine carrier signal $\sin \omega t$ in multipliers $M_3$, $M_4$, respectively. These multiplied outputs are synthesized to provide a transmitted signal. The first and the second spread code have the same length of period and have a uniformly reduced correlation. In the waveform quality measurement to which the invention is directed, the bipolar NRZ signal is not input, and a transmitted signal which results when +1 signal is always input is used as a test signal.

Returning to FIG. 5, the clock (symbol) phase $\tau 1$ which is estimated in the rough parameter estimation unit 15 is fed to a data detector 18, and is also fed to an adder 28. The adder 28 supplies a timing (or phase) to a data detector 19 by adding $\tau_d = T_c/2$ to time $\tau_1$ during the measurement of OQPSK modulating signal and by adding $\tau_d = 0$ to $\tau 1$ during the measurement of QPSK modulating signal. A switching between $\tau_d = 0$ and $\tau_d = T_c/2$ in the adder 28 is controlled by turning the switch 31 on and off.

During the waveform quality measurement of the up-channel or during the measurement of QPSK modulating signal, a real part of the output $Z_1(k)$ from the complex multiplier 16 is directly supplied to the data detector 18 while an imaginary part is directly supplied to the data detector 19. The data detector 18 determines if data at a symbol decision point, namely, data which occurs at every eighth sample after the input clock phase (or timing) $\tau_1$ is positive or negative. If it is positive, 1 is chosen, and if it is negative, 0 is chosen as demodulated data a(n) to be delivered. This is expressed as follows:

$$a(n) = \{\text{Sign}[Re[Z_1(\tau_1 + 8n)]] + 1\}/2 \, (n=0, 1, \ldots) \tag{4}$$

where Sign[x] represents a function which delivers +1 or -1 in a manner corresponding to the sign (positive or negative) of x, and Re[x] represents a real part of a complex number. Similarly, the data detector 19 delivers demodulated data b(n) expressed as follows:

$$b(n) = \{\text{Sign}[Im[Z_1(\tau_1 + \tau_d + 8n)]] + 1\}/2 \, (n=0, 1, \ldots) \tag{5}$$

where Im[z] represents an imaginary part of z.

These demodulated data a(n), b(n) are fed to a PN phase synchronizing unit 20 (which corresponds to the time axis extractor 74 of the prior art). In the PN phase synchronizing unit 20, the phase of a spread code PN in the received CDMA signal is determined to convert it into a true transmitted data, which is then delivered. This is necessary where the S/N ratio of the transmitted signal which is to be measured is degraded, involving a high possibility that an error may be caused in the data detection. In the CDMA scheme according to QUALCOMM Company, PN series which is used in the spreading process is employed as a time reference, and accordingly, the time reference is also extracted in the PN phase synchronizing unit 20.

On the basis of detected transmitted data a(n), b(n), a reference signal generator 21 generates an ideal transmitted signal as a reference signal R(k). The oversampling rate at this time is a quadruple sampling. This reference signal is expressed as follows:

$$R(k) = \sum_{n=k[-L/R]}^{[k+L/R]} I(n) \cdot u(k-nR) + j \sum_{n=[k-L/R]}^{[k+L/R]} Q(n) \cdot u(k-nR-\tau_d) \quad (6)$$

where $\Sigma$ covers from n=[(k−L)/R] to [(k+L)/R]

$$I(n)=2 \cdot a(n)-1 \quad (7)$$

$$Q(n)=2 \cdot b(n)-1 \quad (8)$$

R=4

In the above equation, u(t) represents the characteristic of the baseband filter, R the oversampling rate, 2L+1 a filter tap length. [ ] represents a Gauss' notation.

Detected clock phase τ1 which indicates the temporal relationship between the generated reference signal R(k) and the corrected signal $Z_1(k)$ is also fed to a decimator 29, which operates to decimate the corrected signal $Z_1(k)$ into data series only comprising samples which corresponds to the reference signal on the basis of the value $\tau_1$. Here, the sampling rate of the corrected signal $Z_1(k)$ is reduced from 8 times to 4 times the symbol rate. Placing the corrected signal $Z_1(k)$ which is input to the decimator 29 on the right side-and placing the corrected signal $Z_1(k)$ which represents an output on the left side, the relationship can be mathematically expressed as follows:

$$Z_1(k)=Z_1(\tau_1+2k)(k=0,1,\ldots) \quad (9)$$

In other words, the output comprises every other element of the original corrected signal, starting from $\tau_1$-th element.

A clock phase estimation and interpolation processing unit 24 determines a clock phase error less than a sampling interval, utilizing the decimated corrected signal $Z_1(k)$ and the reference signal R(k). The interpolation is used to achieve a coincidence between a sampling point and a symbol point. In this manner, an interpolated signal $Z_2(k)$ is delivered. The signal $Z_2(k)$ is fed to a carrier phase/frequency error estimation unit 25 where a carrier phase $\phi_2$ and a frequency error $\Omega_2$ are estimated. Using the estimated values $\phi_2$ and $\Omega_2$, a phase rotator generator 33 generates a sinusoidal wave $\exp[j(\phi_2+\Omega_2 k)]$, which is then fed to a complex multiplier 26. A multiplication of the signal $Z_2(k)$ with $\exp[j(\phi_2+\Omega_2 k)]$ takes place in the multiplier 26, thus obtaining a completely corrected signal $Z_3(k)$ which is obtained by correcting the signal $Z_2(k)$. The signal $Z_3(k)$ is fed to a desired item calculation unit 27 where a waveform quality, IQ origin offset, a modulation accuracy and the like are calculated.

Now, the rough parameter estimation unit 15, the clock phase estimation and interpolation processing unit 24, the carrier phase/frequency error estimation unit 25 and the desired item calculation unit 29, all shown in FIG. 5, will be specifically described, and finally, the measurement of time alignment error as defined in the standard IS-97, IS-98, will be described.

Rough Parameter Estimation Unit 15

Figure 7:
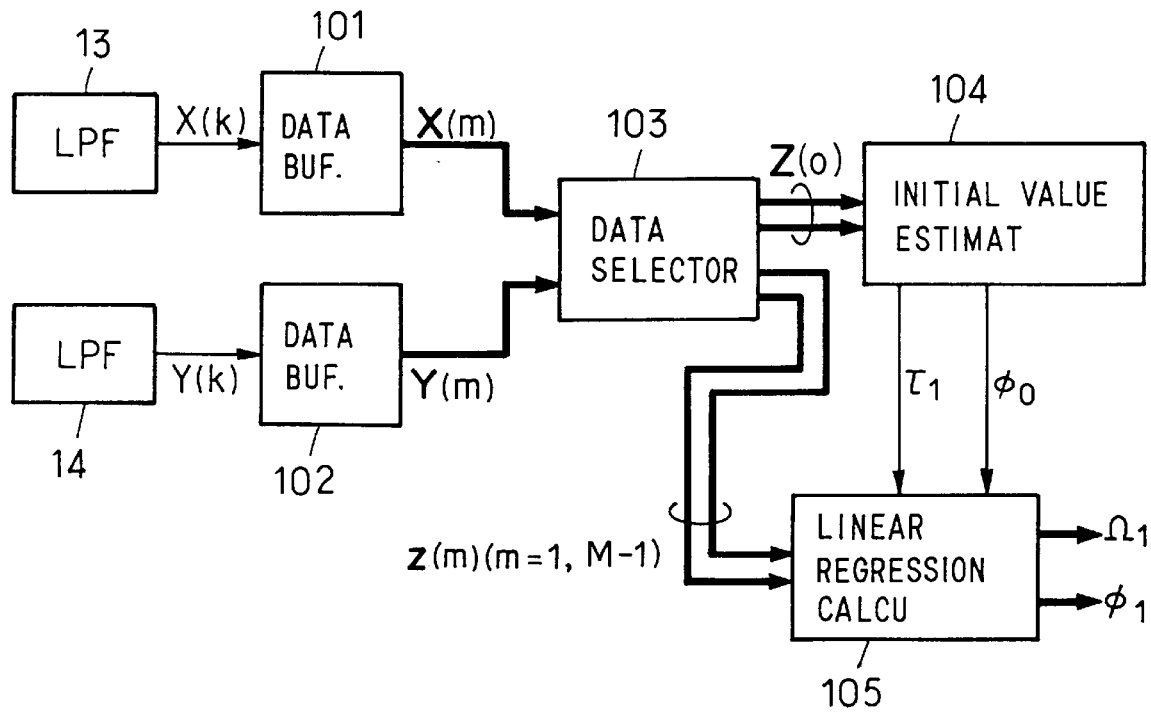
FIG. 7 is a block diagram of a specific example of a rough parameter estimation unit 15 shown in FIG. 5.

Referring to FIG. 7, outputs X(k), Y(k) from the low-pass filters 13, 14 shown in FIG. 5 are once stored in data buffers 101, 102 having a size N, which is defined as follows:

N=L·M

L=K·R

R=8 where R represents the oversampling rate, M the number of divisions and K the number of divided chips. M and K are parameters which determine the algorithmic performance of the estimation unit 15, and are previously determined. Assuming K=48 and M=8, for example, a permissible frequency error will be equal to or less than 1.4 kHz and a frequency estimation accuracy will be equal to or less than 30 Hz.

In the data buffers 101, 102, the stored signals X(k), Y(k) are divided into sub-series each including L samples. These sub-series are defined as vectors X(m), Y(m), as follows:

$$X(m)=(X(L \cdot m), X(L \cdot m+1), \ldots, X(L \cdot m+L-1))$$
$$(m=0, 1, \ldots, M-1) \quad (10)$$

$$Y(m)=(Y(L \cdot m), Y(L \cdot m+1), \ldots, Y(L \cdot m+L-1))$$
$$(m=0, 1, \ldots, M-1) \quad (11)$$

In addition, a complex vector Z(m) is defined including X(m) as a real part and Y(m) as an imaginary part. In FIG. 7, a vector path is indicated by a thick line. The data buffers 101, 102 deliver X(m), Y(m) in the sequence of m=0, 1, ..., M−1, and a data selector 103 delivers an initial vector Z(0) to an initial value estimation unit 104, and delivers the remainder to a linear regression calculation unit 105.

Initial Value Estimation Unit 104

The initial value estimation unit 104 estimates the clock (symbol) phase τ1 and an initial phase value $\phi^0$, which are delivered to the linear regression calculation unit 105. The operation which takes place within the initial value estimation unit 104 will be described with reference to FIG. 8. Output Z(0) from the data selector 103 is fed to complex multipliers 111 to 113 which are equal to 16 multipliers actually. The complex multiplier 111 multiplies a complex number exp $(-j2\pi 0/16)(=1)$ and the complex vector Z(0). Specifically, each element Z(i) (i=0, 1, ..., L−1) of the vector Z(0) is multiplied by $\exp(-j2\pi 0/16)$.

Similarly, the remaining fifteen multipliers multiplies Z(0) by values $\exp(-j2\pi 1/16)$ to $\exp(-j2\pi 15/16)$, respectively. In other words, outputs from these sixteen complex multipliers 111 to 113 represent branch outputs which are obtained by multiplying the vector Z(0) by temporary carrier phase $\exp(-j2\pi p/16)$ (p=0, 1, ..., 15). It will be noted that $\exp(j2\pi 0/16)$ to $\exp(-j2\pi 15/16)$ correspond to values which the carrier phase can assume on the I-Q plane in accordance with the modulation data.

Figure 9:
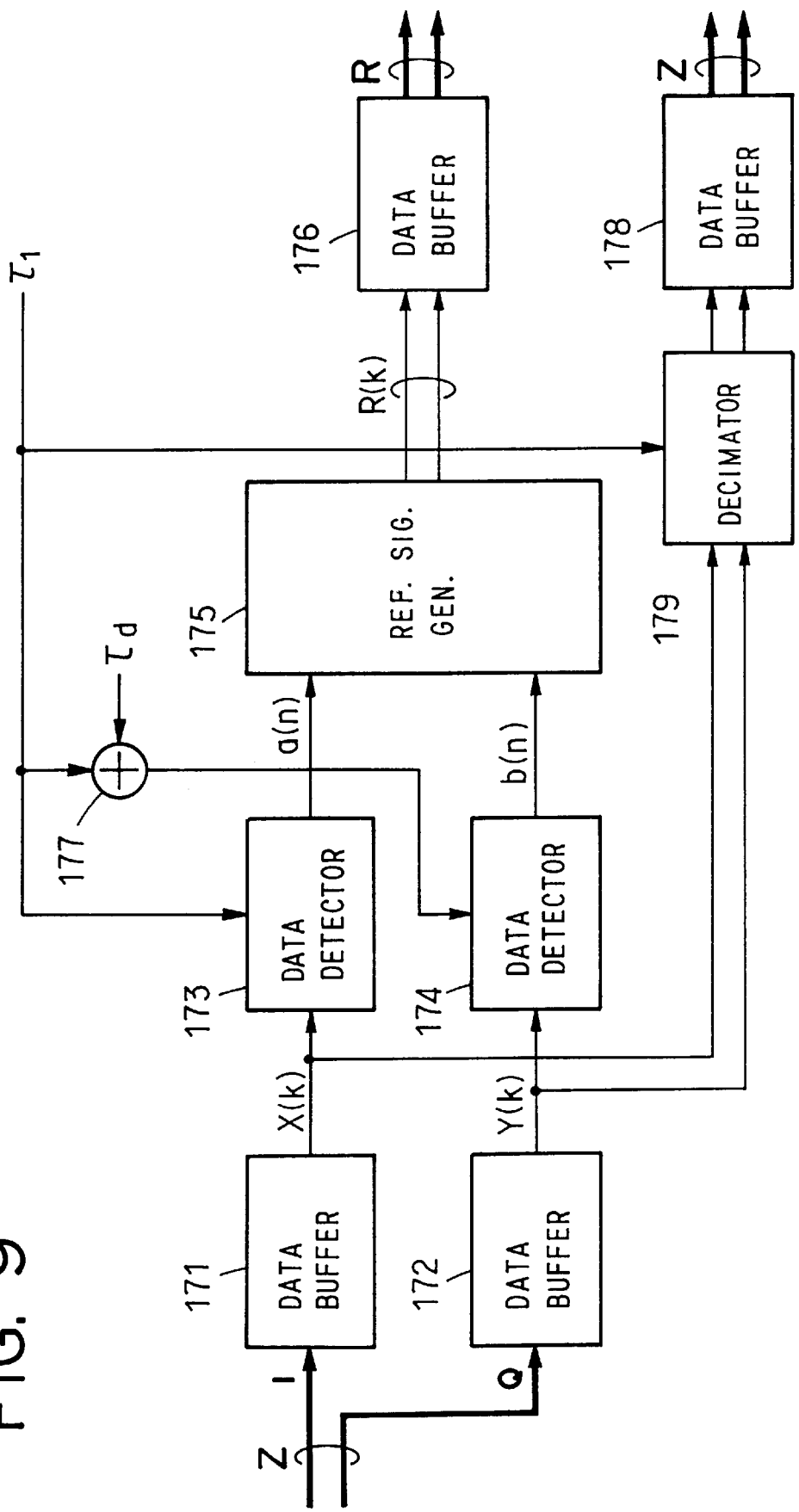
FIG. 9 is a block diagram of a specific example of a data detector and reference signal generator 114 shown in FIG. 8.

A similar processing is applied to each branch output. For example, an output from the multiplier 111 is fed to four data detectors and reference signal generators 114 to 117 which perform an equivalent processing operation. Four different temporary clock (symbol) phases (corresponding to τ=0, 1, 2, 3 in unit of sample) $0T_s$ to $3T_s$ (where $T_s=1/f_s$) are applied to the respective generators 114 to 117, and the data detection takes place on the basis of these phases. Subsequently, the reference signal is generated in accordance with the detected data. In the CDMA signal, the symbol phase is displaced by $T_c/2$, where $T_c=1/f_c$, between the I channel and Q channel. Accordingly, if four consecutive samples from eight samples in one symbol period are examined, an edge of the symbol or the symbol phase can be detected. It is for this reason that the four clock phases are chosen as mentioned previously. The internal construction of the data detector and the reference signal generator is shown in FIG. 9. As shown, the generator essentially comprises data detectors 173, 174, reference signal generator 175, adder 177 and decimator 179 which correspond to the data detectors 18, 19, reference signal generator 21, adder 28 and decimator 29 shown in FIG. 5.

An input from the complex multiplier to the data detector and reference signal generator is a complex vector in FIG.

8, but in FIG. 9, the complex vector Z is divided into real number vectors X, Y for the real part and the imaginary part, which are once stored in data buffers 171, 172. In the similar manner as in FIG. 5, each element of X, Y is fed from the data buffers 171, 172 to data detectors 173, 174 as a time sequence data. The data detectors 173, 174 sample and determine the input data at a phase of $\tau_1, \tau_1+\tau_d$, respectively, (where $\tau_1$ corresponds to one of $0T_s, 1T_s, 2T_s, 3T_s$ shown in FIG. 8). Data from the reference signal generator 175 is once stored in a data buffer 176 and is then delivered as a complex vector, and data from the decimator 179 is similarly once stored in a data buffer 178, and is then delivered as a vector.

In this manner, a branch corresponding to each temporary carrier phase is further branched into four branches which correspond to temporary clock phases. To discriminate outputs from these branches, outputs from the data detectors and reference signal generators are designated by subscript representing each branch. Specifically, a reference signal vector $R_{p,s}$ and corresponding measuring signal $Z_{p,s}$ have a subscript $p(p=0, 1, \ldots, 15$ corresponding to a phase $\exp(-j2\pi p/16))$ which corresponds to the carrier phase and another subscript $S(S=0, 1, 2, 3)$ which corresponds to the clock phase.

Figure 8:
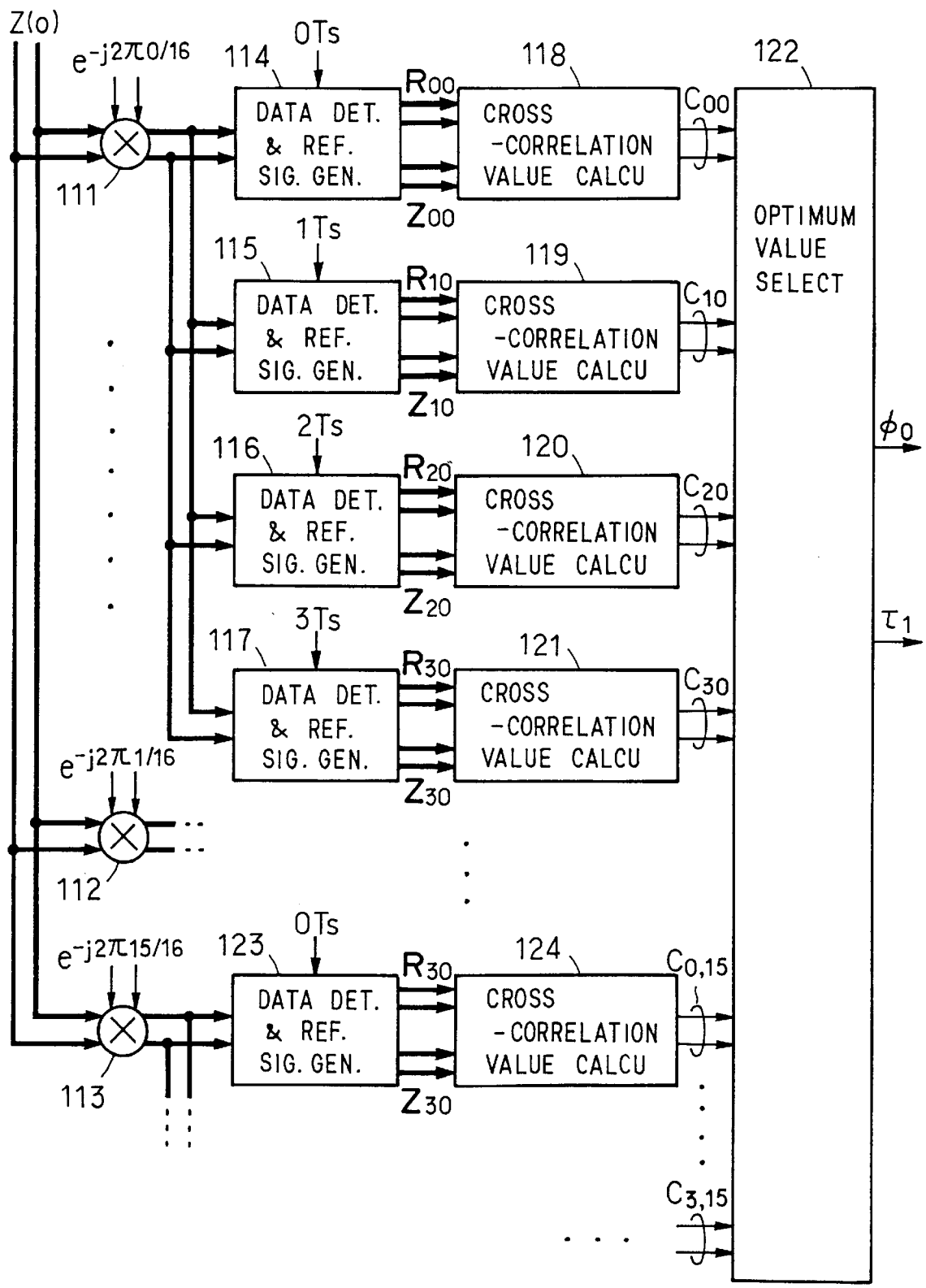
FIG. 8 is a block diagram of a specific example of an initial value estimation unit 104 shown in FIG. 7.

FIG. 8 shows cross-correlation value calculation units 118 to 124, each of which calculates a cross-correlation value $C_{p,s}$ between the reference signal vector $R_{p,s}$ from an associated generator and a measuring signal vector $Z_{p,s}$, and cross-correlation values $C_{p,s}$ ($p=0, 1, \ldots, 15; S=0, 1, 2, 3$) from all the branches are supplied to an optimum value selector 122.

The optimum value selector 122 determines a correct carrier phase and a correct clock phase from the cross-correlation values supplied ($C_{0,0}, C_{1,0}, \ldots, C_{15,3}$) by a procedure mentioned below.

1. A set (p, S) is determined which provides a maximum for the square of the absolute magnitude of cross-relation value $C_{p,s}$. It is possible that a plurality of such sets exist.

2. Among sets which provide the maximum, a particular set (p, S) which gives a maximum value for the real part of $C_{p,s}$ is determined. Only one such set exists, and corresponding values of p, S are chosen as optimum values.

Using the chosen values of p and S, the clock phase $\tau_1$ and the initial carrier phase $\phi_0$ are calculated as follows:

$$\tau_1 = S \quad (12)$$

$$\phi_0 = p\pi/16 + \text{Arg}[C_{p,S}] \quad (13)$$

where Arg[ ] represents a complex function which gives a phase angle.

Linear Regression Calculation Unit 105

Figure 10:
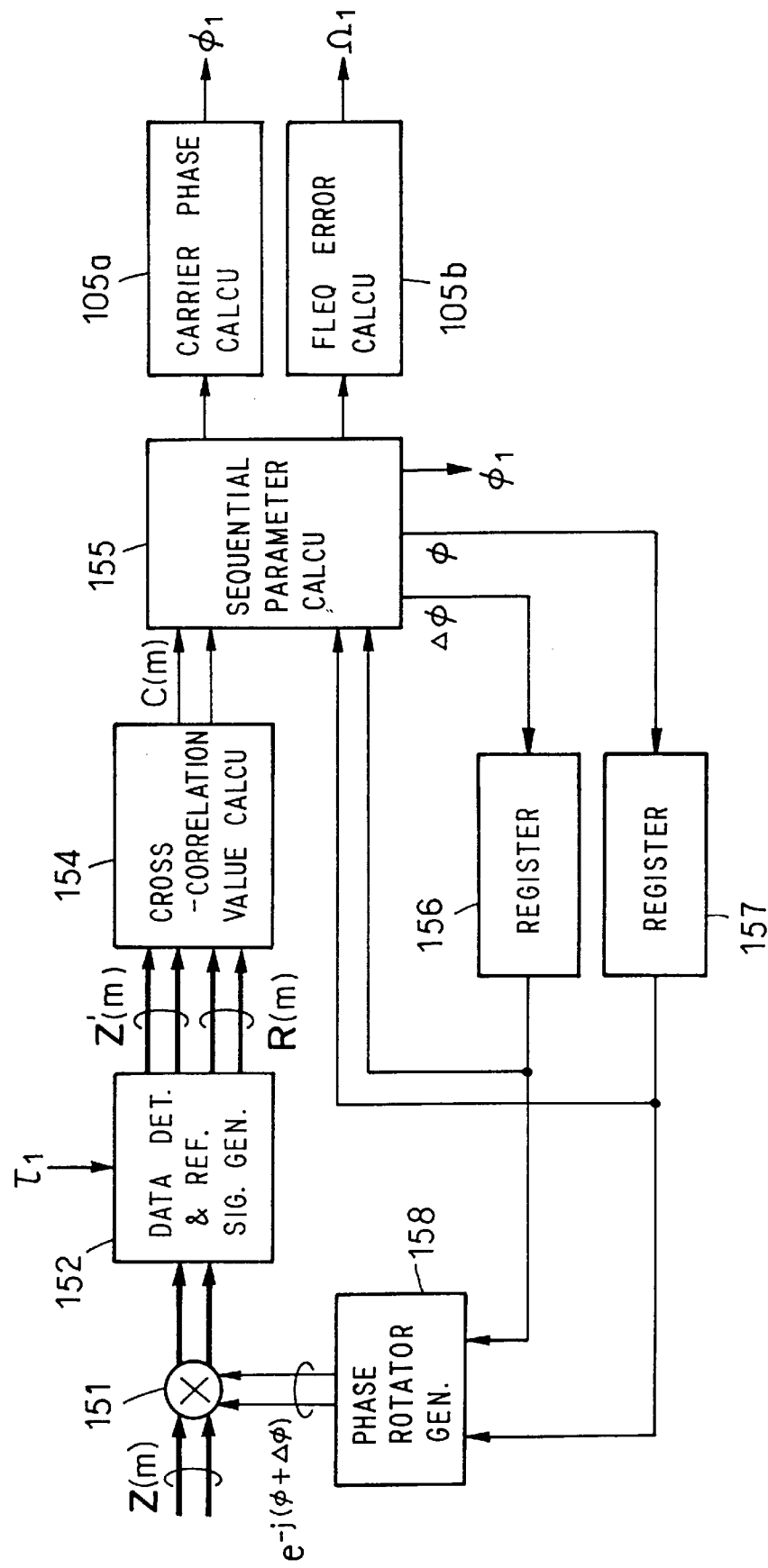
FIG. 10 is a block diagram of a specific example of a linear regression calculation unit 105 shown in FIG. 7.

The clock phase $\tau_1$ and the initial carrier phase $\phi_0$ which are obtained by the initial value estimation unit 104 are fed to the linear regression calculation unit 105 shown in FIG. 7. An output Z(m) (m=1, 2, ..., M–1) from the data selector 103 is also fed as a time sequence to the linear regression calculation unit 105. The operation which takes place within the linear regression calculation unit 105 will be described with reference to FIG. 10. Vector Z(m) from the data selector 103 is multiplied by an output from a phase rotator generator 158 in a complex multiplier 151. The phase rotator generator 158 calculates a complex value $\exp[-j(\phi+\Delta\phi)]$ from phases $\Delta\phi, \phi$ stored in registers 156, 157, and delivers it to the multiplier 151. Initial values of the respective values stored in the registers 156, 157 are equal to 0, $\phi_0$.

An output from the complex multiplier 151 is fed to a data detector and reference signal generator 152, which is constructed in the same manner as the data detectors and reference signal generators 114 to 117 shown in FIG. 8, and $\tau1$ determined in the initial value estimation unit 104 shown in FIG. 7 is supplied as a clock phase thereto. Reference signal vector R(m) generated in the data detector and the reference signal generator 152 and corresponding measuring signal vector Z'(m) are fed to a cross-correlation value calculation unit 154, thus calculating a cross-correlation value C(m). The cross-correlation value calculation unit 154 operates in same manner as the cross-correlation value calculation units 118 to 124 shown in FIG. 8, and calculates a cross-correlation value in accordance with the following equation:

$$C(m) = \Sigma Z'(m,l) \cdot R^*(m,l) \quad (14)$$

where $\Sigma$ covers from l=0 to L'–1, Z'(m,l) represents an lth element of vector Z'(m), R(M,l) represents an lth element of vector R(m), L' represents a number of elements, and R*(m,l) is a complex conjugate of R(m,l). The cross-correlation value C(m) is delivered to a sequential parameter value calculation unit 155, which calculates a current value of each parameter according to the following equations:

$$\phi(m) = \phi(m-1) + \text{Arg}[C(m)] + \Delta\phi(m-1) \quad (15)$$

$$S_0(m) = S_0(m-1) + \phi(m) \quad (16)$$

$$S_1(m) = S_1(m-1) + (m+1)\phi(m) \quad (17)$$

$$\Delta\phi(m) = [6\{2 \cdot S_1(m) - (m+2)S_0(m)\}]/(m(m+1)(m+2)) \quad (18)$$

Values of $\Delta\phi, \phi$ which prevailed one time interval before are fed from registers 156, 157. $S_0, S_1$ are internal variables of the sequential parameter value calculation unit 155. The current values of the $\Delta\phi, \phi$ which are calculated are stored in registers 156, 157, respectively, and the similar processing operation is repeated for a next time sequence data of the vector Z(m). In this manner, the value of each parameter is sequentially updated from m=1 to M–1, and finally, a carrier phase $\phi_1$ is determined by a carrier phase calculation unit 105a according to the following equation (19) and a phase variation per sample $\Omega_1$ is determined by a frequency error calculation unit 105b according to the following equation (20), and these are delivered as outputs from the rough parameter estimation unit 15:

$$\phi_1 = \{-6S_1(M-1) + 2(2M+1)S_0(M-1)\}/(M(M-1)) + \Delta\phi(M-1)/2 \quad (19)$$

$$\Omega_1 = \Delta\phi(M-1)/L \quad (20)$$

Fine Parameter Estimation Unit 23

The fine parameter estimation unit 23 shown in FIG. 5 performs an estimation of a clock phase error and a carrier frequency error with higher accuracy. Initially, an estimation of a clock phase error and a correction of a signal according to the interpolation process are effected in the clock phase estimation and interpolation processing unit 24. For the corrected signal, a further correction of the signal is made, by estimating a carrier phase and a frequency error in the carrier/frequency error estimation unit 25 to generate a complex sinusoidal wave of a frequency thus determined, and multiplying it with the corrected signal from the processing unit 24. This completes a signal correction in accordance with the clock phase and the carrier phase according to the present algorithm, and the finally corrected signal is delivered to the desired item calculation unit 27.

The principle of operation of the fine parameter estimation unit 23 will be described first, and specific calculation means will be described separately for the clock phase estimation and interpolation unit 24 and the carrier phase/ frequency error estimation unit 25. The principle of estimating a clock phase τ, a carrier phase φ, and a carrier frequency f is to determine the parameters τ, φ and f so as to maximize a logarithmic likelihood function given as follows:

$$ \Lambda L(\phi, f, \tau) = \text{Const.} \{\exp(-j\phi)C(f,\tau) + \exp(j\phi)C^*(f,\tau)\} \quad (21) $$

where C(f,τ) is given as follows:

$$ C(f, t) = \int_0^{T0} Z(t - \tau)\exp(-j2\pi ft)R^*(t)dt \quad (22) $$

where Z(t), R(t) represent a measuring signal and a reference signal, and $T_0$ represents a measuring interval (which is used to estimate the parameters). It is to be noted that these signals are continuous signals. On the other hand, signals used in FIG. 5 are discrete signals. For a common signal, a discrete signal and a continuous signal is related to each other. For example, a continuous expression R(t) and a discrete expression R(k) of a reference signal are related as follows:

$$ R(k) = R(kT_s) $$

A sampling interval $T_s$ is a reciprocal of a sampling frequency $f_s$. In the fine parameter estimation unit 23, the oversampling rate is quadruple.

$$ f_s = R \cdot f_c $$
$$ R = 4 $$

As to the principle of such estimation, it is to be noted that a corresponding principle is derived in "Digital Communication" by Proakis, published by McGrow-Hill Company in 1989, Second edition, page 333, in particular at equation 4.5.71). Specifically, the following simultaneous equations including partial derivatives by respective parameters and which are set equal to zero are solved for the parameters φ, f, τ.

$$ \exp(-j\phi)C(f,\tau) - \exp(j\phi)C^*(f,\tau) = 0 \quad (23) $$

$$ \exp(-j\phi)\partial C/\partial \tau + \exp(j\phi)\partial C^*/\partial \tau = 0 \quad (24) $$

$$ \exp(-j\phi)\partial C/\partial f + \exp(j\phi)\partial C^*/\partial f = 0 \quad (25) $$

When these simultaneous equations are solved, they can be modified to the following simultaneous equations which do not include φ:

$$ \partial |C(f,\tau)|^2/\partial \tau = 0 \quad (26) $$

$$ \partial |C(f,\tau)|^2/\partial f = 0 \quad (27) $$

Estimation means used in the fine parameter estimation unit 23 is based on the equations (23) to (27) on the premise that rough values of these parameters are estimated in the rough parameter estimation unit 15, and the signal is corrected in accordance with these values. Accordingly, values of parameters which are to be estimated by the fine parameter estimation unit 13 are sufficiently close to zero, and this justifies the use of approximations in the equations (23) to (27) with a satisfactory accuracy. Calculation means used in the fine parameter estimation unit 23 calculates values of parameters using the equations (23) to (27), specifically, according to the following procedure.

Step 1.

Putting f=0, τ is determined from the equation (26). This is premised on the assumption that an estimated frequency f is determined by the rough parameter estimation unit 15 with an estimation error equal to or less than 30 Hz. At this time, the approximation of putting f=0 in the equation (26) is reasonable. Similarly, it is assumed that τ is determined with a resolution of $T_c/8$ (A/D sampling interval).

Step 2.

Using τ which is determined by putting f=0, φ is determined from the equation (23). This is premised on the assumption that f is determined by the rough parameter estimation unit 15 with an estimation error equal to or less than 30 Hz. At this time, the approximation of putting f=0 in the equation (23) is reasonable.

Step 3.

Using τ, φ which are thus determined, f is determined from the equation (25). Again, it is assumed that f is determined by the rough parameter estimation unit 15 with an estimation error equal to or less than 30 Hz.

Calculation process will be specifically described below. Clock Phase Estimation and Interpolation Processing Unit 24

In this processing unit 24, the step 1 is specifically carried out, and followed by an interpolation processing, thus correcting the signal so that the sampling point and the symbol point agree.

Initially, C(O, τ) is modified by replacing an integral by a sum, as indicated below:

$$ C(O, \tau) = T_s \Sigma Z(kT_s - \tau) \cdot R^*(kT_s) \quad (28) $$

where Σ covers from k=0 to K-1, and $T_s = T_c/4$, and a measuring interval $T_0$ is $T_0 = KT_s$. It would appear that the expression according to the equation (28) requires that the value of the measuring signal Z(t) at an arbitrary time be known in advance in accordance with the value of τ. However, Z(t) is a band limited signal and a continuous signal is expressed in terms of a discrete signal Z(k) as follows:

$$ Z(t) = \Sigma(nT_s) \cdot s(t - nT_s) \quad (29) $$

where Σ covers from n=-∞ to ∞, s(t) represents the characteristic of an interpolation filter having a frequency response such that the phase characteristic is linear with respect to the phase while the amplitude characteristic is flat in the pass band of Z(t), with aliasing components resulting from the sampling cut off. In actuality, the sum indicated in the equation (29) must be made over a finite interval. At this end, it is assumed that the interpolation filter has a zero phase and a response time of $T_F$ or $$ s(t) = 0 (|t| > T_F/2) \quad (30) $$

At this time, the measuring signal can be expressed as follows:

$$ Z(kT_s - \tau) = \sum_{m=-M}^{M} Z(kT_s - mT_s)s(mT_s - \tau) \quad (31) $$

where $T_F = (2m+1)T_s$ is used. Using the equation (31), the equation (28) can be expressed in terms of discrete signals Z(k), R(k) as follows:

$$ C(0, \tau) = T_s \sum_{k=0}^{K-1} \sum_{m=-M}^{M} Z(k-m)s(mT_s - \tau) \cdot R^*(k) \quad (32) $$

Assuming a measuring interval of $KT_s$ (k=0 to K-1), Z(k) must be measured in a time interval from k=-M to K+M-1. Next, $s_m = s(mT_s - \tau)$ is approximated by the following quadratic equation of τ:

$$S_m(\tau) = a_m + b_m\tau + c_m\tau^2 \quad (33)$$

Since $\tau$ to be estimated lies in a range defined by the inequality $|\tau| < T_s/4$, it is sufficient that the approximation applies in this range. Using this, $C(0, \tau)$ is given as follows:

$$C(0, \tau) = T_s \sum_{k=0}^{K-1} R^*(k) \sum_{m=-M}^{M} Z(k-m)(a_m + b_m\tau + c_m\tau^2) \quad (34)$$

$$= T_s(A + B\tau + C\tau^2) \quad (35)$$

where A, B, C are given as follows:

$$A = \sum_{k=0}^{K-1} R^*(k)a'(k) \equiv \sum_{k=0}^{K-1} R^*(k) \sum_{m=-M}^{M} Z(k-m)a_m \quad (36)$$

$$B = \sum_{k=0}^{K-1} R^*(k)b'(k) \equiv \sum_{k=0}^{K-1} R^*(k) \sum_{m=-M}^{M} Z(k-m)b_m \quad (37)$$

$$C = \sum_{k=0}^{K-1} R^*(k)c'(k) \equiv \sum_{k=0}^{K-1} R^*(k) \sum_{m=-M}^{M} Z(k-m)c_m \quad (38)$$

Substitution of the equation (35) into the equation (26) yields an equation for $\tau$ as follows:

$$Re[C(0,\tau)\partial C^*(0,\tau)/\partial \tau] = (T_s)^2 Re[(A+B\tau+C\tau^2)(B^*+2C^*\tau)] = 0 \quad (39)$$

While this is a cubic equation of $\tau$, using a linear approximation assuming that $\tau$ is small, a calculation formula to determine the clock phase $\tau$ is given as follows:

$$\tau = -Re[AB^*]/(|B|^2 + 2Re[AC^*]) \quad (40)$$

The value of $\tau$ thus determined is used to correct the measuring signal $Z(k)$. Since the corrected measuring signal is represented as $Z(kT_s-\tau)$, it is seen from the equations (31) and (33) that the calculation formula is given as follows:

$$Z(kT_s - \tau) = \sum_{m=-M}^{M} Z(k-m)s(mT_s - \tau) \quad (41)$$

$$= \sum_{m=-M}^{M} Z(k-m)(a_m + b_m\tau + c_m\tau^2)$$

$$= a'(k) + b'(k)\tau + c'(k)\tau^2$$

where it is to be noted that a'(k), b'(k), c'(k) are already obtained in the process of calculating the equations (36), (37), (38), respectively.

The characteristic $S_m(\tau)$ of the interpolation filter can be determined as follows, for example. On the basis of Nyquist filter (Raised-Cosine), choosing an NULL interval for an impulse response of $T_c/2$ ($T_c/4=T_s$), a roll-off factor of 0.4, a substantially null impulse response for $|t| > 4T_c$, and approximating the impulse response of the interpolation filter for each interval having a length $T_s$ with a quadratic equation $\sigma_m(\eta) = \sigma(m/2-\eta)$, $b_m$, $c_m$ are determined from the following equations:

$$\begin{bmatrix} A & B \\ C & D \end{bmatrix} \begin{bmatrix} b_m \\ c_m \end{bmatrix} = \begin{bmatrix} D_m \\ E_m - \sigma_m(0)A \end{bmatrix}$$

$$A = \int_{-1/4}^{1/4} \eta^2 d\eta = 1/96, \quad B = \int_{-1/4}^{1/4} \eta^3 d\eta = 0$$

$$C = \int_{-1/4}^{1/4} \eta^2 d\eta = 1/2560, \quad D_m = \phi \int_{-1/4}^{1/4} \sigma_m(\eta)\eta d\eta$$

$$E_m = \int_{-1/4}^{1/4} \sigma_m(\eta)\eta^2 d\eta, \quad \eta = \tau/(T_c/2)$$

where m represents an interval number, and a choice is made such that $a_m = \sigma_m(0)$.

Figure 11:
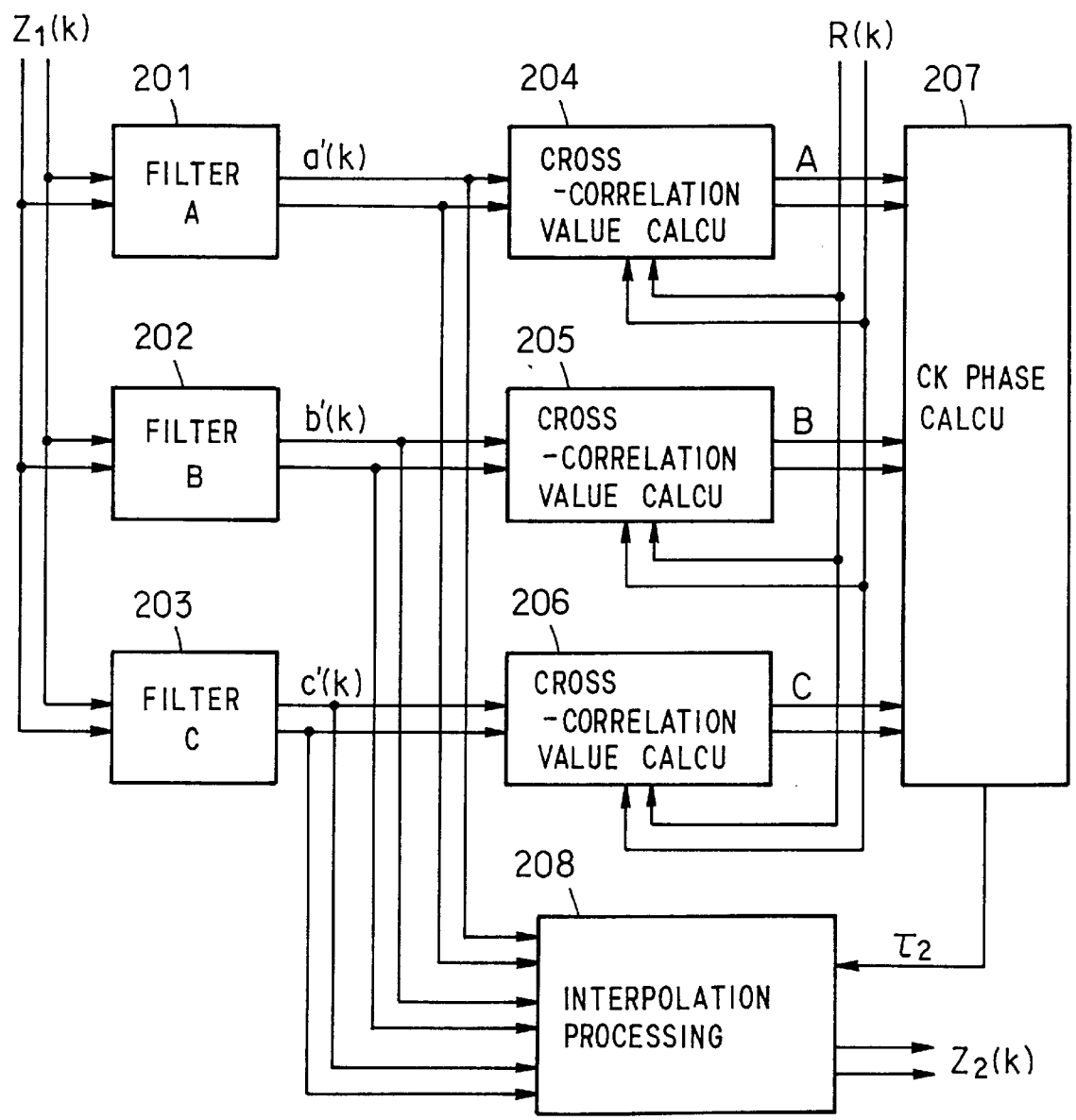
FIG. 11 is a block diagram of a specific example of a clock phase estimation and waveform interpolation processing unit 24 shown in FIG. 5.

Calculation means described above is shown in FIG. 11. The measuring signal $Z(k)$ used in the calculation which is performed by the clock phase estimation and waveform interpolation processing unit 24 is input as signal $Z_1(k)$ in FIG. 11 (and also in FIG. 5). The measuring signal $Z_1(k)$ is subject to a filtering operation indicated on the right sides of the equations (36) to (38) in filters A 201, B 202, C 203 which use the filter coefficients $a_m$, $b_m$, $c_m$, respectively, thus delivering outputs a'(k), b'(k), c'(k). These outputs are fed to the cross-correlation value calculation units 204, 205, 206 together with the reference signal $R(k)$, and A, B, C indicated on the left sides of the equations (36) to (38) are calculated and fed to a clock phase calculation unit 207, where the clock phase $\tau_2$ is calculated according to the equation (40). The unit of $\tau_2$ depends on the choice of the filter coefficients $a_m$, $b_m$, $c_m$. In the present example, the unit is equal to $T_c/2$. a'(k), b'(k), c'(k) and $\tau_2$ are fed to an interpolation processing unit 208 where the corrected signal $Z_2(k)$ is calculated according to the equation (41).

Carrier Phase/Frequency Error Estimation Unit 25

The carrier phase/frequency error estimation unit 25 shown in FIG. 5 actually performs the steps 2 and 3 mentioned above. Initially, at the step 2, the carrier phase $\phi$ is determined from the following equation:

$$\exp(-j\phi)C(0,\tau) - \exp(-j\phi)C^*(0,\tau) = 0 \quad (42)$$

The equation (42) can be simplified to $\exp(j\phi) = C(0,\tau)$ where $\tau$ represents the clock phase previously obtained. Denoting the measuring signal $Z_2(k)$ which is previously corrected by $Z(k)$ and using the equation (28), we have:

$$\exp(-j\phi) = \sum_{k=0}^{K-1} Z(k) \cdot R^*(k) \quad (43)$$

Accordingly, a calculation formula which determines the carrier phase $\phi$ is obtained as follows:

$$\phi = Arg\left[\sum_{k=0}^{K-1} Z(k) \cdot R^*(k)\right] \quad (44)$$

Next, at step 3, the frequency error f is determined from the following equation:

$$\partial Re(\exp(-j\phi)C(f,\tau))/\partial f = 0 \quad (45)$$

$\phi, \tau$ represent the carrier phase and the clock phase which are determined in the manner above. Using the previously corrected measuring signal for $Z(k)$, and referring to the equation (42), $C(f,\tau)$ is given as follows:

$$C(f, \tau) = T_s \sum_{k=0}^{K-1} Z(k)\exp[-j2\pi fkT_s] \cdot R^*(k) \quad (46)$$

Substitution of this equation into the equation (45) yields:

$$Re[\exp(-j\phi) \sum_{k=0}^{K-1} (-j2\pi kT^2_s)Z(k)\exp[-j2\pi fkT_s] \cdot R^*(k) = 0 \quad (47)$$

It is assumed that the product of the frequency error f to be estimated and the measuring time interval $KT_s$ is small enough to allow the following approximation:

$$\exp[-j2\pi fkT_s] = 1 - j2\pi fkT_s (k=0, 1, \ldots, K-1) \quad (48)$$

Substitution of the equation (48) into the equation (47) yields an calculation formula which determines the frequency error f as follows:

$$f = (1/2\pi T_s) Im\left[\exp(-j\phi) \sum_{k=0}^{K-1} kZ(k)R^*(k)\right] / \quad (49)$$

$$Re\left[\exp(-j\phi) \sum_{k=0}^{K-1} k^2 Z(k)R^*(k)\right]$$

Also, a phase variation per sample $\Omega = 2\pi T_s f$ is given as follows:

$$\Omega = Im\left[\exp(-j\phi) \sum_{k=0}^{K-1} kZ(k)R^*(k)\right] / Re\left[\exp(-j\phi) \sum_{k=0}^{K-1} k^2 Z(k)R^*(k)\right] \quad (50)$$

Figure 12:
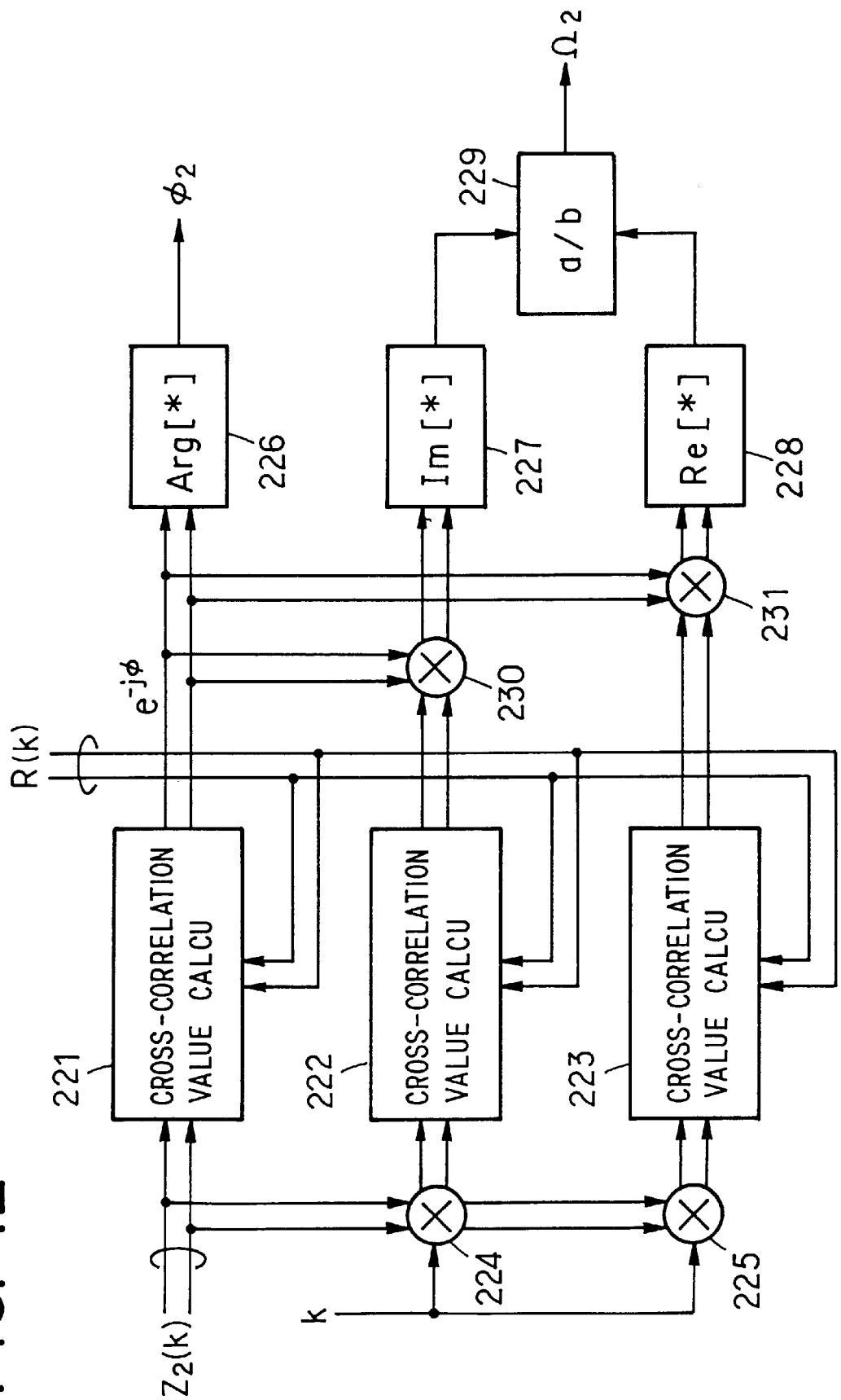
FIG. 12 is a block diagram of a specific example of a carrier phase/frequency error estimation unit 25 shown in FIG. 5.

Calculation means for the calculation mentioned above is shown in FIG. 12. The corrected measuring signal Z(k) which is used in the calculation of the carrier phase and the frequency error in a manner as mentioned above is input to the carrier phase/frequency error estimation unit 25 as signal $Z_2(k)$. The signal $Z_2(k)$ is initially fed to a cross-correlation value calculation unit 221 where $\exp(-j\phi)$ is calculated according to the equation (43). The signal $Z_2(k)$ is also fed to a complex multiplier 224 to be multiplied by k, and its output $kZ_2(k)$ is fed to a cross-correlation value calculation unit 222 where $$\sum_{k=0}^{K-1} kZ(k)R^*(k)$$

is calculated. $kZ_2(k)$ is also fed to a complex multiplier 225 to be multiplied by an integer k, and its output $k^2z_2(k)$ is fed to a cross-correlation value calculation unit 223 where $$\sum_{k=0}^{K-1} k^2 Z(k)R^*(k)$$

is calculated.

Outputs from the cross-correlation value calculation units 222, 223 are fed to complex multipliers 230, 231, respectively, to be multiplied by $\exp(-j\phi)$. Outputs from the complex multipliers 230, 231 are fed to an Im[ ] calculation unit 227 and an Re[ ] calculation unit 228, respectively, where respective imaginary parts and real parts are calculated. Their outputs represent a numerator and a denominator of the equation (50), respectively, and a phase variation per sample $\Omega_2$ is calculated in a divider 229.

On the other hand, an output from the cross-correlation value calculation unit 221 is also fed to an Arg[ ] calculation unit 226 where the carrier phase $\phi_2$ is calculated.

Desired Item Calculation Unit 27

The desired item calculation unit 27 shown in FIG. 5 calculates a waveform quality ρ, a modulation accuracy, IQ origin offset (Carrier Feedthru), using the output $Z_3(k)$ from the complex multiplier 26 and the output R(k) from the reference signal generator 21. By definition, the waveform quality ρ is calculated by the following equation:

$$\rho = \left|\sum_{k=0}^{K-1} Z_3(k)R^*(k)\right|^2 / \sum_{k=0}^{K-1} |Z_3(k)|^2 \sum_{k=0}^{K-1} |R(k)|^2 \quad (51)$$

This calculation formula corresponds to the Waveform Quality Factor which is defined in the standard IS-98. The modulation accuracy and the IQ origin offset are determined in the similar manner as in the prior art, as will be described below.

Parameters $\alpha_0$, $B_0$ having complex values are determined so as to minimize $$\sum_{k=0}^{K-1} |R^*(k) - \alpha_0 Z_3(k) + B_0|^2.$$

Differentiating this mathematical expression and setting it equal to zero provide simultaneous linear equations, solutions of which can be obtained as follows:

$$B_0 = \left(\sum_{k=0}^{K-1} R(k) \sum_{k=0}^{K-1} |Z_3(k)|^2 - \sum_{k=0}^{K-1} R(k)Z_3^*(k) \sum_{k=0}^{K-1} Z_3(k)\right) / \quad (52)$$

$$\left(\left|\sum_{k=0}^{K-1} Z_3(k)\right|^2 - K\sum_{k=0}^{K-1} Z_3(k)|Z_3(k)|^2\right)$$

$$\alpha_0 = \left(\sum_{k=0}^{K-1} R(k) \sum_{k=0}^{K-1} Z_3^*(k) - K\sum_{k=0}^{K-1} R(k)Z_3^*(k)\right) / \quad (53)$$

$$\left(\left|\sum_{k=0}^{K-1} Z_3(k)\right|^2 - K\sum_{k=0}^{K-1} |Z_3(k)|^2\right)$$

By using $\alpha_0$, $B_0$ thus determined, the modulation accuracy and the IQ origin offset are calculated in a manner indicated below.

Modulation Accuracy:

$$\sqrt{\frac{\sum_{k=0}^{K-1} |E(k)|^2}{\sum_{k=0}^{K-1} |R(k)|^2}} \quad (54)$$

where $E(k) = R^*(k) - \alpha_0 Z_3(k) + B_o$

IQ origin offset:

$$\sqrt{\frac{K|B_o|^2}{\sum_{k=0}^{K-1}|R(k)|^2}} \qquad (55)$$

Measurement of Time Alignment Error

Figure 13:
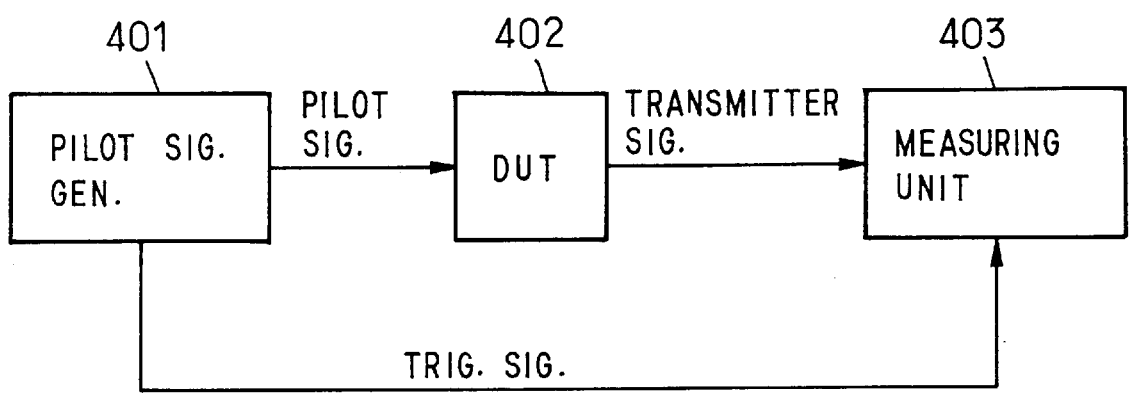
FIG. 13 is a block diagram of a system arrangement used to effect a measurement of time alignment error.

The measurement of time alignment error which is described here is given as one of items to be determined in the "waveform quality measurement" defined in the standard IS-98. To implement such measurement, a communication with a transmitter of a radio base station of the mobile communication is necessary, as indicated in FIG. 13. A pilot signal generator 401 supplies a pilot signal, which comprises a radio channel signal, similar to that used in a normal down-channel, to a unit 402 to be tested, which is a mobile terminal of the CDMA scheme according to QUALCOMM Company. The pilot signal comprises a QPSK modulation of two PN series data which have no correlation in the similar manner as mentioned above in connection with FIG. 6. The unit 402 to be tested is determined to deliver a transmitted signal (up-signal) shown in FIG. 6 comprising the OQPSK modulation which is spread with the same PN series data in synchronism with the received pilot signal.

The measurement of time alignment error comprises determining a time difference between the PN series in the pilot signal which is received by the unit 402 to be tested and the PN series which is contained in the transmitted signal.

The pilot signal generator 401 supplies a trigger signal to a measuring unit 403, which provides a trigger to commence the measurement. The measuring unit 403 commences its measuring operation in response to the trigger signal. Specifically, when the rising level of the trigger signal exceeds a threshold value, the storage into a buffer memory of a measuring signal from the unit 402 to be tested, namely, the transmitted data therefrom after its A/D conversion is commenced.

The trigger signal which is applied from the pilot signal generator 401 delivers a pulse at a given phase in the PN series in synchronism with the PN series of the pilot signal. Accordingly, if it is allowed to neglect signal delays caused by cables and by a circuit within the measuring unit 403, the time when measuring signal data which is initially stored in the buffer memory is acquired is the time when the particular phase in the PN series of the pilot signal is delivered. If the phase in the PN series of the measuring signal data is known, its time difference with respect to the PN series of the pilot signal can be recognized, and this represents a time alignment error.

To effect the measurement of time alignment error, the phase in the PN series of the measuring signal (namely, an input signal from the unit 402 to be tested) must be known. At this end, the measuring unit 403 performs a phase synchronization of the PN series of the measuring signal. In the present embodiment, this is carried out by PN series phase synchronization technique which employs the demodulated data a(n), b(n) shown in FIG. 5. Accordingly, the PN series phase synchronizing means which is employed in the PN phase synchronizing unit 20 shown in FIG. 5 will be described.

PN Phase Synchronizing Unit 20

Figure 14:
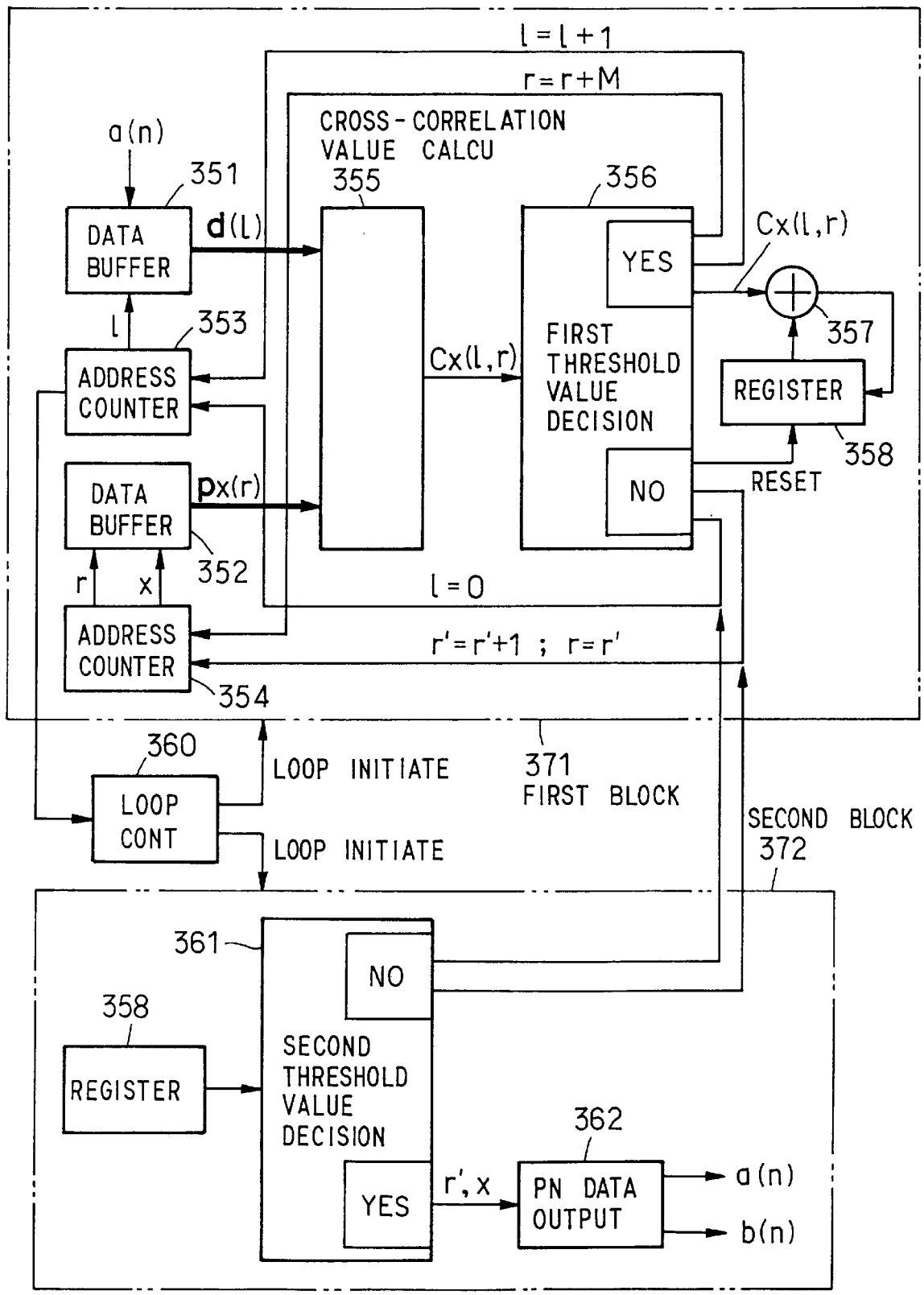
FIG. 14 is a block diagram of a specific example of a PN phase synchronizing unit 20 shown in FIG. 5.

A specific example of synchronizing means in the PN phase synchronizing unit 20 is shown in FIG. 14. Demodulated data a(n), b(n) from the data detectors 18, 19 shown in FIG. 5 assume a value of either 1 or −1. Only a(n) is input to the PN phase synchronizing unit 20. In the synchronization test according to the CDMA scheme, a test signal is a transmitted signal which prevails in the absence of input data. As mentioned previously, since the data (symbol) period is chosen to be equal to each chip period of spread codes $PN_1$, $PN_2$, the demodulated data a(n) represents either I-channel or Q-channel of $PN_1$, $PN_2$. The demodulated data a(n) is once stored in a data buffer 351, which divides the stored a(n) into sub-series each including M chips, this being denoted as vector d(l) thus $$d(l)=(a(Ml), a(Ml+1), \ldots a(Ml+M-1)) \ (l=0, 1, \ldots, L-1) \qquad (56)$$

The size N=L·M of the data buffer 351 and the number M of chips divided are determined by values which are required to achieve a correct PN synchronization. For example, N=64, M=16.

On the other hand, stored in a data buffer 352 are data for one period of a pilot PN in-phase channel i(r) and data for one period of a pilot PN quadrature channel q(r) as defined in chapters 6 and 7 of the standard IS-95. The leading end of the period of the PN code may be chosen anywhere, but we choose the leading one of fifteen zero's which follow one after another. With respect to data for one period of the PN code of the I-Q channel, sub-series containing M chip (samples) is defined as follows:

$$P_i(r)=(i(r),i(r+1), \ldots, i(r+M-1))(r=0, 1, \ldots, 2^{15}-1) \qquad (57)$$

$$P_q(r)=(q(r),q(r+1), \ldots, q(r+M-1))(r=0, 1, \ldots, 2^{15}-1) \qquad (58)$$

The PN phase synchronizing unit 20 is controlled by a loop controller 360. The loop controller 360 initiates the operation of each loop. When a value stored in an internal memory of an address counter 353 is updated, the loop controller 360 examines this value, and initiates a first block 371 when the value is equal to 0, initiates a second block 372 when the value is equal to 1 and initiates a next loop in the same block as that when the previous loop was effected otherwise.

When each loop is initiated, a value l stored in an internal memory of the address counter 353, a value r stored in an internal memory of an address counter 354 and an index vector which indicates by "x" one of $P_i(r)$, $P_q(r)$ are simultaneously taken out from the data buffers 351 and 352. Initial value of the values l, r, r' stored in the internal memories of the address counters 353, 354 are zero while the initial value of the value x in an internal memory is equal to i.

A cross-correlation calculation unit 355 calculates a cross-correlation $C_x(l,r)$ defined by the following equation:

$$C_x(l, r) = \sum_{m=0}^{M-1} a(Ml + m) \cdot x(r + m) \qquad (59)$$

using the vectors d(l) and $P_x(r)$(where x indicates either i or q) from the buffers 351, 352.

This value assumes one of values from −16 to 16, and is deliver to a first threshold value decision unit 356 where a conditional decision is rendered depending on whether the absolute magnitude of an input value is greater or less than a preset threshold value. The threshold value may be preset to 11, for example, if an error up to two bits among 16 bits is permitted.

If the decision rendered by the first threshold decision unit 356 indicates that the input value is greater, that value is delivered to an adder 357, which adds this value with a value stored in a register 358, with a result of addition stored in the register 358. In addition, decision unit 356 delivers an instruction to increment the value l stored in the internal memory by one to the address counter 353. It also delivers an instruction to increment the value r stored in the internal memory by M to the address counter 354.

Alternatively, when the value of the cross-correlation $C_x(l, r)$ is less than the preset threshold value, the register 358 is reset. The decision unit 356 then delivers an instruction to reset the internal memory to the address counter 353 and also delivers an instruction to the address counter 354, which indicates incrementing value r' stored in the internal memory by one, followed by substituting the value r' for the value r in the internal memory. These instructions to the address counters 353, 354 are issued synchronously, and this timing is detected by the loop controller 360 to initiate the next loop.

As long as the input to the first threshold value decision unit 356 continues to be greater than the preset threshold value, the content of the internal memory of the address counter 353 continues to increase from l=0 to L−1. Finally, the first threshold value decision unit 356 delivers the cross-correlation value $C_x(l, r)$ to the adder 357, and when the internal memory of the address counter 353 is incremented by one for the next time, the loop controller 360 detects that this value reached L, thus initiating the operation of the second block 372 during the next loop.

In the second block 372, a value stored in the register 358 of the first block 371 is fed to a second threshold value decision unit 361. When the absolute magnitude of this value is greater than a preset threshold value, a decision is rendered that an agreement is reached between demodulated data in the data buffer 351 and PN pattern from the data buffer 352, or that a PN phase synchronization is established.

If the absolute magnitude of the value stored in the register 358 does not exceed the preset threshold value, an instruction is issued to the address counter 353 to reset the value l in its internal memory, and another instruction is issued to the address counter 354 to increment the value r' stored in its internal memory by one. These operations are detected by the loop controller 360, which initiates the next loop operation in the first block 371. In this manner, a pattern which is synchronized with the detected transmitted data is searched for among PN series contained in the data buffer 352. Initially, x=i is chosen to search the I channel and when $r'=P(=2^{15})$, a change to r'=0, x=q is made to search the Q channel before establishing r=r'.

After the synchronization is established, a PN pattern corresponding to the transmitted data which is detected on the basis of values r', x stored in the internal memory of the address counter 354 at that time is obtained from the data buffer 352. Representing the sign of the value in the register 358 by SIGN, the transmitted data which corresponds to the detected transmitted data is given as follows:

when x=i $$a(n)=SIGN \cdot i(r'+n) \quad (60)$$

$$b(n)=SIGN \cdot q(r'+n) \quad (61)$$

when x=q $$a(n)=SIGN \cdot q(r'+n) \quad (62)$$

$$b(n)=-SIGN \cdot i(r'+n+1) \quad (63)$$

Here, data which is obtained by the PN phase synchronization is denoted a(n), b(n) anew. Phase r' for the demodulated data of the detected PN series is used in calculating a time alignment error. If demodulated data contains an error, data which is obtained through the PN phase synchronization or data from the data buffer 352 becomes equal to one which is correctly transmitted. Accordingly, if there is an error in demodulated data which is detected by the data detectors 18, 19 shown in FIG. 5, correct demodulated data in which the error has been corrected is fed to the reference signal generator 21. It is possible to detect a chip error in the transmitted signal and/or to estimate an error rate by comparing the demodulated data against the data from the data buffer 352 which is obtained through the PN phase synchronization.

Method of Calculation of Time Alignment Error

Figure 15:
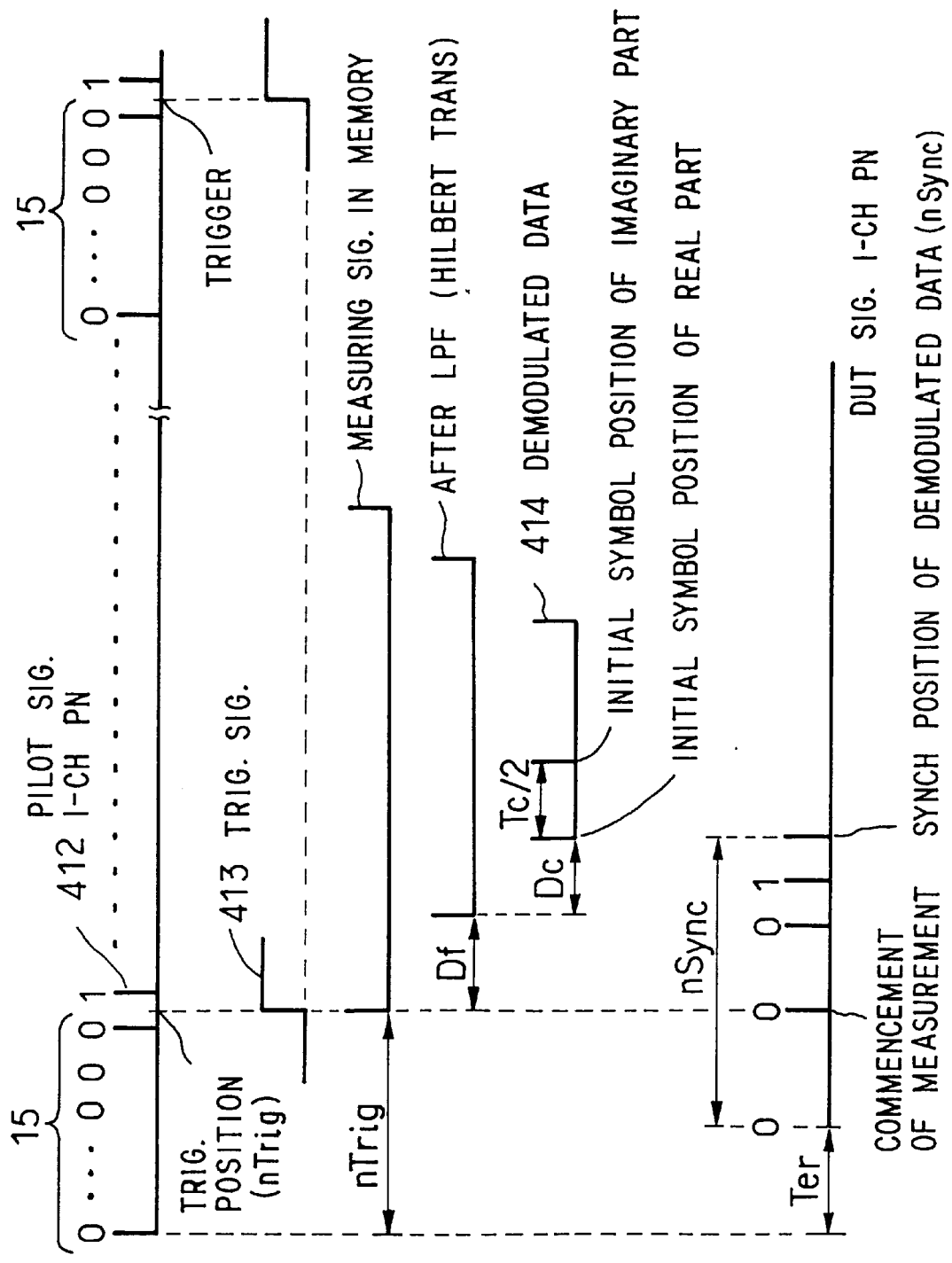
FIG. 15 is a timing chart illustrating a relationship between a pilot signal, a measuring signal, demodulated data and a time alignment error.

A method of calculating a time alignment error using the PN phase r' which is obtained by the PN synchronizing unit 20 will now be described. As shown in FIG. 15, a trigger signal 413 is supplied from the pilot signal generator 401 (FIG. 13) to the measuring unit 403 in synchronism with PN series 412 of the pilot signal. For example, when the PN code generator comprises a shift register having 15 stages, there is a location in the PN series where 14 0's follow in succession. Another 0 is added to the end of such succession to determine the end of the PN series. Accordingly, a trigger signal 413 has its pulse rising just at a midpoint between the last 0 in the succession of 15 0's and the next 1 or the symbol point, and the measurement is commenced from this point in time. When a temporal position of the trigger system 413, as measured from the leading symbol point in the I channel PN series 412 of the pilot signal, is denoted by nTrig, nTrig= 14.5 (in chip units) in the example shown in FIG. 15.

Since the phase synchronization of the PN series takes place with respect to the demodulated data a(n) 414, it is necessary to know the temporal position of the leading symbol point in the demodulated data. Since the leading end of the measuring data in the buffer memory 5 shown in FIG. 1 represents the rising time of the trigger signal, it is sufficient to know a particular number of data, as counted from the leading end of the memory 5 shown in FIG. 1, to which the demodulated data 414 corresponds. It is to be noted that the leading symbol point in the demodulated data 414 is displaced from the leading end of the measuring data by an amount corresponding to a sum of a delay $D_f$ caused by the FIR filtering by the low-pass filters 13, 14 shown in FIG. 5 and the location (Dc) of the first symbol point in the real part of the measuring signal Z(k), as counted in sampling unit. The location of the first symbol point in the real part of the measuring signal Z(k) is given by $$nTrig \cdot T_c + (D_f + D_c) \cdot T_s$$

as referenced to the leading symbol point in the I channel PN series 412 of the pilot signal. On the other hand, if the demodulated data 414 of the real part is the I channel PN series 412 of the pilot signal, PN phase r' obtained in the PN phase synchronizing unit 20 represents the PN phase of the first symbol point, which may be denoted as nSync. As will be apparent from FIG. 15, the time alignment error Ter is then given as follows:

$$Ter=(nTrig-nSync) \cdot T_c + (D_f + D_c) \cdot T_s \quad (64)$$

Alternatively, if the demodulated data 414 of the imaginary part is the I channel PN series of the pilot signal, the PN phase r' obtained in the PN phase synchronizing unit 20 represents the PN phase of the first symbol point in the imaginary part, and accordingly, the time alignment error Ter is given as follows:

$$Ter=(nTrig-nSync+(\tfrac{1}{2}))) \cdot T_c + (D_f + D_c) \cdot T_s \quad (65)$$

Since the time alignment error Ter thus obtained represents the resolution of the sampling period Ts, it may be added with $\tau_2$ which is obtained during the clock phase estimation taking place in the fine parameter estimation unit 23 to provide a time alignment error with a higher accuracy.

In the synchronization method illustrated in FIG. 15, if a result of calculation in the cross-correlation value calculation unit 355 exceeds a first threshold value, the establishment of the phase synchronization may be estimated when cross-correlation values for all the divided sub-vectors exceed the first threshold value, rather than cumulatively adding correlation values together.

For the CDMA spread signal according to QUALCOMM Company, the PN phase r' or nSync can be determined by other method than the example given above. For example, a method illustrated in FIG. 16 may be employed. Outputs from the low-pass filters 13, 14 shown in FIG. 5 are fed to a matched filter 501 for the first PN series and a matched filter 502 for the first PN series, respectively, and to a matched filter 503 for the second PN series and a matched filter 504 for the second PN series, respectively. A local oscillator 505 which is used to convert the input PN series into the baseband signal in the multipliers 11, 12 feeds a sine wave signal and a cosine wave signal to the multiplier 11, 12, but it is unnecessary that the sine wave signal be synchronized with a carrier signal from the input terminal 10. Outputs from the matched filters 501 and 504 are added together in an adder 506 while an output from the matched filter 503 is subtracted from an output of the matched filter 502 in a subtractor 507.

Each output from the adder 506 and the subtractor 507 are multiplied in multipliers 508, 509, respectively, and are then added together in an adder 511 to be delivered to an output terminal 512. If required, arctangent of outputs from the adder 506 and the subtractor 507 may be formed in a calculation unit 513 to be delivered to an output terminal 514.

In this arrangement, when the oscillation frequency of the oscillator 505 agrees with the carrier frequency of the input spread signal, and when the phase is also in phase, for example, the matched filters 501, 504 simultaneously deliver pulses at their outputs at the time when the first and the second PN series match the modulated first and second PN series of the input signal, respectively, and these pulses are added together in the adder 506, which then delivers a pulse. The matched filters 502, 503 do not produce pulses. When the phase of the sine wave from the oscillator 505 is at 90° with respect to the carrier phase of the input signal from the terminal 10, no pulses are output from the matched filters 501, 504, but the matched filters 502, 503 simultaneously deliver pulses of opposite polarities when a matching occurs with respect to the modulated first and the second PN series of the input signal, and these pulses are added together in the subtractor 507, which delivers a pulse. It will be seen from the foregoing description that pulses having amplitudes which depend on the phases of the oscillator signal from the oscillator 505 with respect to the carrier of the input spread signal are simultaneously delivered from the adder 506 and the subtractor 507, respectively, when a matching occurs with the first and second spread series of the input spread signal. Accordingly, when the respective outputs from the adder 506 and the subtractor 507 are squared in the squaring units 508, 509 and are then added together in the adder 511, a pulse is obtained when a matching occurs with the first and the second PN series if the oscillator 505 is not in phase synchronization with the carrier of the input signal. A time interval from the commencement of the operation of the measuring unit 403 in response to the trigger signal until a pulse is delivered from the adder 511 represents the PN phase nSync. In this arrangement, it is unnecessary to synchronize the oscillator 505 with the carrier of the input signal, merely requiring a quasi-synchronous quadrature detection of the input signal. In this respect, the arrangement is simplified, also eliminating the need for the processing operation illustrated in FIG. 15 in which the phase of the PN series is sequentially displaced. By obtaining an arctangent of a quotient obtained by dividing the output from the subtractor 507 with the output from the adder 506, or $\tan^{-1} \theta$, in the arctangent calculation unit 513, the phase $\theta$ of the carrier of the input signal is obtained. A change in this $\theta$ indicates that there is an offset between the carrier frequency of the input signal and the oscillation frequency of the oscillator 505.

Figure 16:
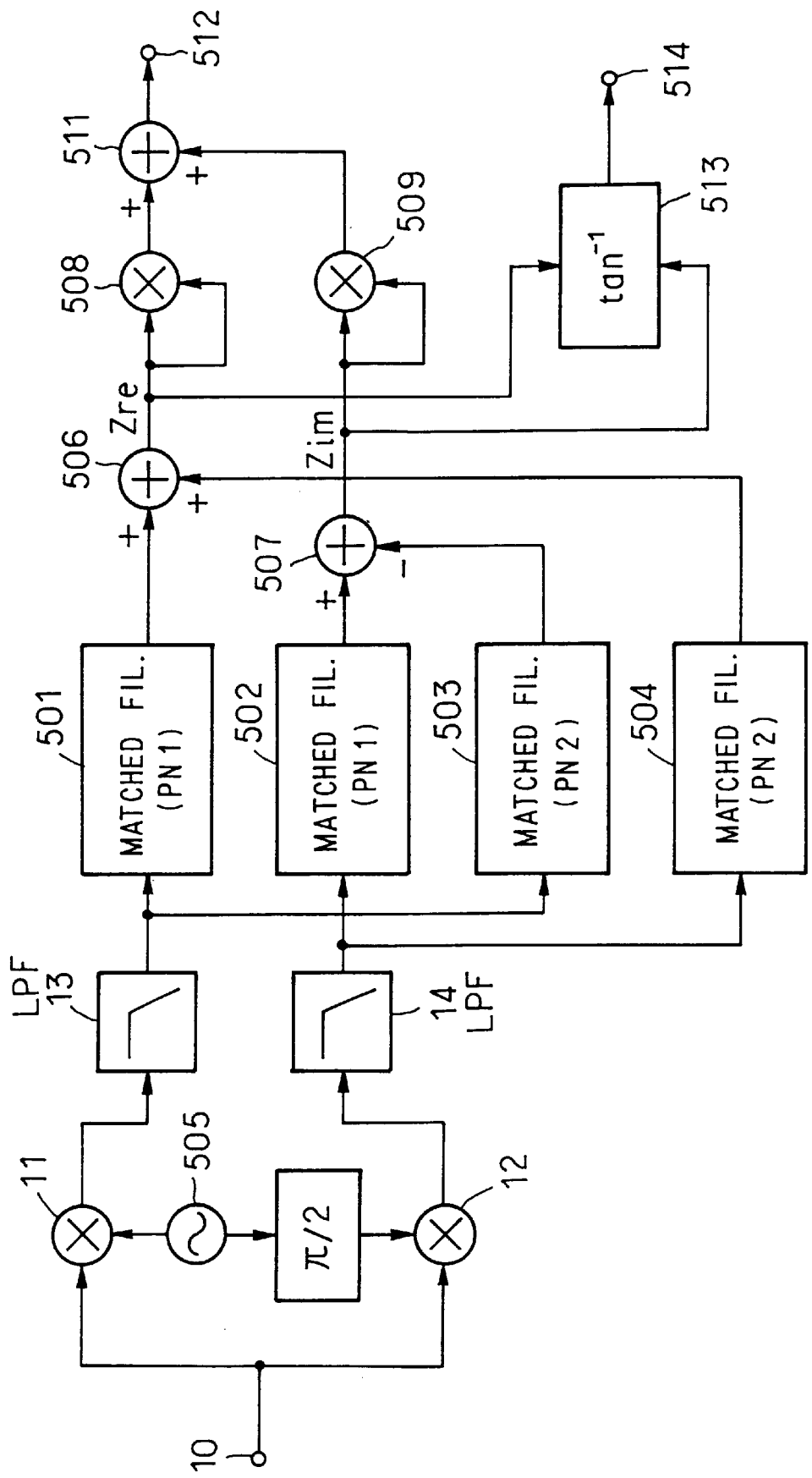
FIG. 16 is a block diagram of another technique of measuring PN phase.
Figure 17:
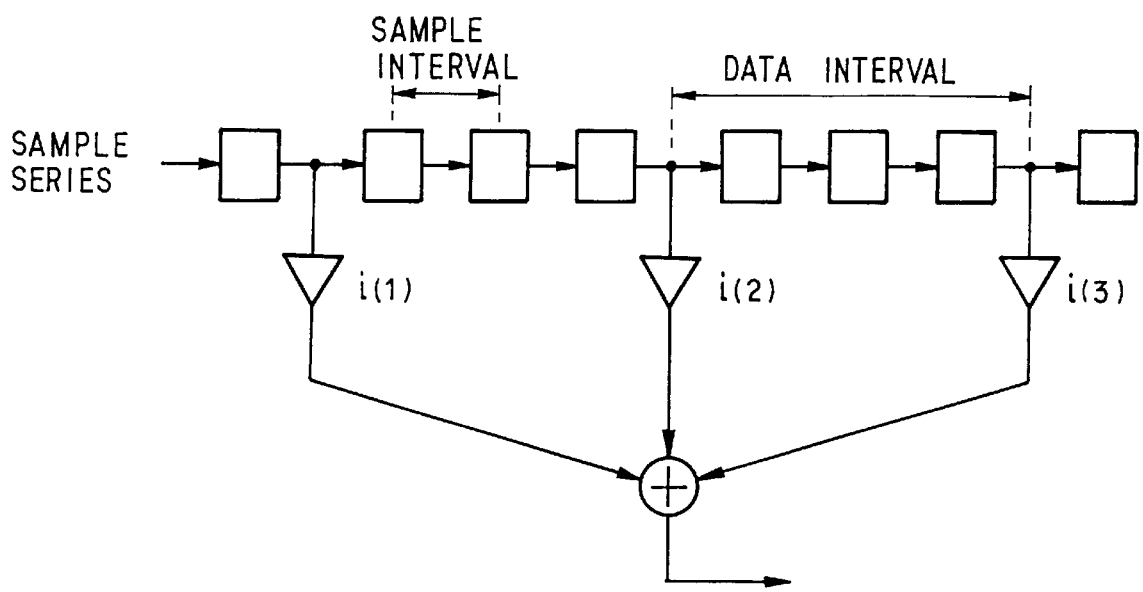
FIG. 17 is a block diagram of a functional arrangement which makes a matched filter shown in FIG. 16 to be applicable to a digital signal.

An input spread signal from the input terminal 10 or the real part and imaginary part signal of a complex signal converted from the input spread signal, namely, the respective output signals from the low-pass filters 13, 14 are sampled at a sampling rate which is higher than the data rate to convert them into digital signals which are then stored in memories. The stored data is multiplied by coefficients of the matched filters, and the multiplied values are added together to provide a matched filter processing operation. In this instance, multiplication with the coefficients takes place not with respect to each sampling data in the memory, but with every sample which corresponds to the data rate of the spread signal. This is illustrated by an equivalent diagram in FIG. 17. This multiplication and addition is sequentially repeated for a sample data group which is successively displaced by one sample. When such matched filter processing is applied to data stored in the memory in the manner corresponding to four matched filters 501 to 504 as shown in FIG. 16, and their outputs processed in the similar manner as shown in FIG. 16, there can be obtained an inversely spread output, allowing the PN phase nSync to be determined. In this instance, the coefficients of the matched filter is either +1 or −1, and therefore there is no need to form a product, requiring a change in the sign followed by an addition.

Figure 4:
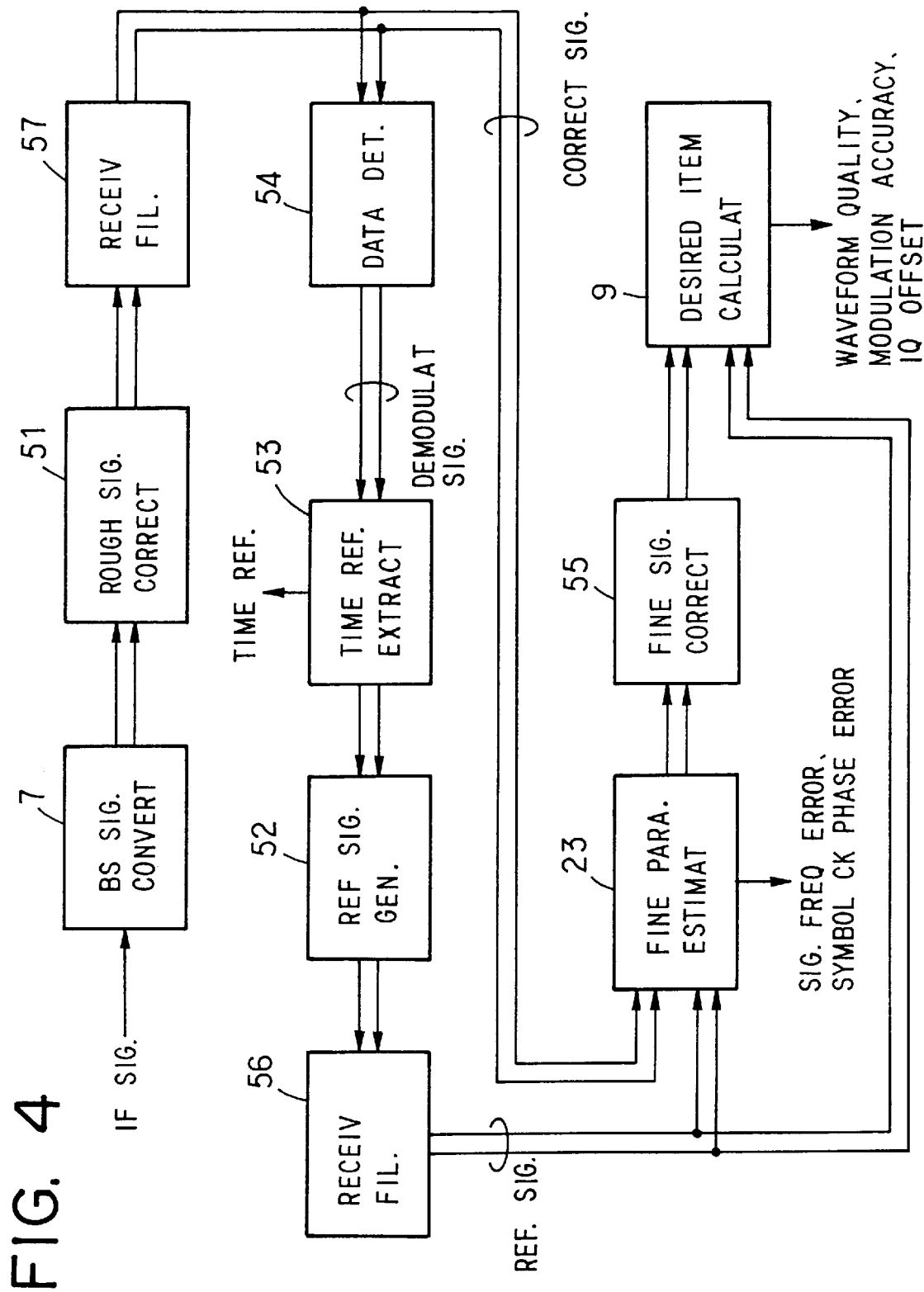
FIG. 4 is a block diagram showing a fundamental functional arrangement of a parameter measuring apparatus according to the invention.

What has been described above illustrates the application of the invention to the measurement of the OQPSK modulating signal, but the invention is also applicable to the measurement of a variety of digital quadrature modulating signals such as QAM, PSK, FSK, or the like. Where the modulating signal is not of CDMA scheme, the PN phase synchronizing unit 20 may be replaced by a time reference extractor. The receiving filter 56, 57 shown in FIG. 4 may be used in accordance with the modulating signal, and their characteristic are chosen so as to conform to the standard.

As to the time axis extractor 20, it is defined in the standard how it should choose a burst wave of TDMA wave and at what timing it should calculate the waveform quality or modulation factor, and it is used in the extraction of the time axis for the calculation. Accordingly, it is not needed to the measurement of the frequency error $\Omega_2$, carrier phase $\phi_2$ and clock phase $\tau_2$. The time axis extractor 20 is also needed for measuring the time alignment error. In accordance with the invention, it is sufficient that at least one of the clock phase $\tau_2$, frequency error $\Omega_2$ and the carrier phase $\phi_2$ be measured, and the measurement of the waveform quality is not always necessary. In addition, the invention may be used in the measurement of not only the waveform quality, but also the modulation accuracy, IQ origin offset or the like.

In the foregoing description, blocks in each FIGURE principally illustrate their functions which can be executed by digital signal processor or by computer software.

As discussed above, in accordance with the invention, parameters of input quadrature modulating signal are subject to a rough estimation in the rough parameter estimation unit, and an estimates therefrom are used to correct a complex baseband signal. A data detection is made from the corrected baseband signal, and a reference signal is generated therefrom. Using these data and signal, parameters are estimated with good accuracy in the fine parameter estimation unit 23. Accordingly, the invention enables a synchronous detection without requiring a delayed detection, allowing the measurement of parameters of quadrature modulating signal of any type. Parameters can be measured with a good accuracy in a modulation scheme which does not satisfy the requirements that only the simple point need be considered and that an estimation of the clock phase without the use of the transmitted data is possible.

In other words, in accordance with the invention, the fine parameter estimation unit 23 is applicable to any modulation scheme provided data detection in the rough parameter estimation unit 15, temporary reference signal generator and data detectors 18, 19, the time extractor 20, reference signal generator 21, and if required, receiving filters 56, 57 are modified in accordance with the modulation scheme of the input signal.

When the synchronization technique illustrated in FIG. 15 is employed, the synchronization can be established in a time interval which is shorter than that required when the input is not divided into sub-series.

What is claimed is:

1. A parameter estimating apparatus for estimating parameters of an input digital quadrature modulation signal, comprising;

first means for effecting a quadrature detection of input digital quadrature modulation signal to obtain a complex baseband signal in the form of a digital data time sequence;

second means for effecting a rough parameter estimation of the complex baseband signal to obtain rough estimated transmission parameters and for effecting a rough signal correction of the complex baseband signal using the thus obtained rough estimated transmission parameters to thereby obtain a rough corrected complex baseband signal;

third means for effecting a data detection of the rough corrected complex baseband signal using the thus obtained rough estimated transmission parameters to obtain demodulated data;

fourth means for generating an ideal transmitted signal as a reference signal which corresponds to the input signal, using the demodulated data; and fifth means for effecting a fine parameter estimation of the rough corrected complex baseband signal using the reference signal to thereby obtain fine estimated transmission parameters.

2. The parameter estimating apparatus according to claim 1 wherein the second means comprises sixth means for estimating parameters from the complex baseband signal with an accuracy which is more rough than the estimation performed by the fifth means, and seventh means for correcting the complex baseband signal using the parameters which are estimated by the sixth means.

3. The parameter estimating apparatus according to claim 2 wherein the sixth means estimate a carrier frequency error per sample $\Omega_1$, a carrier phase $\phi$ and a clock phase $\tau_1$.

4. The parameter estimating apparatus according to claim 3 wherein the correction applied by the second means is a correction only in regard of the frequency error $\Omega_1$ and the carrier phase $\phi$ of the complex baseband signal, and wherein the data detection by the third means takes place at a timing corresponding to the clock phase $\tau_1$.

5. The parameter estimating apparatus according to claim 4 wherein the sixth means comprises:

means for multiplying a plurality of complex numbers having different phases which correspond to a plurality of candidates for the carrier phase with one of subseries divided from the series of the complex baseband signal for providing the respective sub-series with different phase rotation, means for effecting data detection from the respective phase rotated sub-series of the complex baseband signal at a plurality of symbol points which correspond to a plurality of candidates for the clock phase, means for forming a plurality of temporary reference signals from the detected data, means for forming a cross-correlation between each of the temporary reference signals and each of the phase rotated sub-series of the complex baseband signal, respectively, means for determining the clock phase $\tau_1$ and initial carrier phase $\phi_0$ from a maximum one among all of the cross-correlations, and means for causing a phase rotation of each of remaining sub-series divided from the series of the complex baseband signal through the initial carrier phase $\phi_0$ which corresponds to the maximum one of the cross-correlations, and a detection of similar cross-correlations as mentioned being applied to the phase rotated sub-series by using the clock phase $\tau_1$ to determine and update the clock phase, and for repeating such process to determine the carrier phase $\phi_1$ and the frequency error $\Omega_1$.

6. The parameter estimating apparatus according to claim 4 wherein the sixth means comprises:

data buffers each having a size N and supplied with a real part X(k) and an imaginary part Y(k) of the complex baseband signal, respectively, for dividing the supplied signal into a plurality of sub-series each including L samples which are defined as vectors X(m) and Y(m) of a complex vector Z(m), where m=0,1, . . . , M−1;

an initial value estimation unit supplied with an initial vector Z(0) of the complex vector Z(m) for estimating a clock phase $\tau_1$ and an initial carrier phase $\phi_0$; and a linear regression calculation unit supplied with the remainder of the vectors Z(m) and responsive to the clock phase $\tau_1$ and initial carrier phase $\phi_0$ from the initial value estimation unit for calculating the carrier phase $\phi_1$ and the carrier frequency error per sample $\Omega_1$ as outputs of the rough parameter estimation unit.

7. The parameter estimating apparatus according to claim 1 wherein the fifth means comprises:

eighth means including means for estimating the clock phase $\tau_2$ from the corrected complex baseband signal and the reference signal and means for determining a symbol point from the estimated clock phase $\tau_2$ and for interpolating the corrected complex baseband signal to a signal including the symbol point as its sampling point, and ninth means for estimating at least one of the frequency error $\Omega_2$ and the carrier phase $\phi_2$ from the interpolated complex baseband signal and the reference signal.

8. The parameter estimating apparatus according to claim 7 wherein the eighth means comprises:

tenth means for filtering the corrected complex baseband signal with three filter characteristics having coefficients trains which are represented by three coefficients of a quadratic function for the clock phase $\tau$, eleventh means for forming cross-correlations between the three filtered signals and the reference signal, twelfth means using a quadratic function of $\tau$ having three coefficients which are formed by results of said cross-correlations to determine $\tau$ which maximizes the value of the quadratic function and choosing such $\tau$ as the clock phase $\tau_2$, and thirteenth means using three filtering results obtained by the tenth means and the clock phase $\tau_2$ to provide the interpolated signal.

9. The parameter estimating apparatus according to claim 7 wherein the ninth means comprises:

fourteenth means for forming a cross-correlation between the interpolated complex baseband signal and the reference signal, fifteenth means for determining a phase difference of the interpolated complex baseband signal relative to the reference signal using a result obtained by the fourteenth means and choosing such phase difference as the carrier phase $\phi_2$, sixteenth means for forming a product of the interpolated complex baseband signal and each of a sequence number k in a signal sample train which is used as a time unit and $k^2$, seventeenth means for forming a cross-correlation between each of the products with k and $k^2$ formed by the sixteenth means and the reference signal, eighteenth means for forming a product between results of two cross-correlations formed by the seventeenth means and a result of cross-correlation formed by the fourteenth means, and nineteenth means for dividing an imaginary part of the product with k formed by the eighteenth means by the real part of the product with $k^2$ formed by the eighteenth means to provide the frequency error $\Omega_2$.

10. A measurement system comprising:

the parameter estimating apparatus according to claim 7;

a phase rotator generator generating a sinusoidal wave in response to the carrier phase $\phi_2$ and the frequency error $\Omega_2$ supplied from the ninth means;

a complex multiplier effecting a multiplication of the interpolated complex baseband signal $Z_2(k)$ with the sinusoidal wave, to thereby obtain a finally corrected signal $Z_3(k)$; and a desired item calculation unit calculating at least one of waveform quality, IQ origin offset, a modulation accuracy, and time alignment error using the thus obtained finally corrected signal $Z_3(k)$.

11. The parameter estimating apparatus according to one of claims 1 to 5 further including:

delay means for delaying the detection of the imaginary part of the corrected complex baseband signal by one-half clock period during the data detection by the third means when the input digital quadrature modulation signal is OQPSK signal, and twentieth means for synchronizing local first and second PN series with respect to the detected data obtained by the third means and delivering sub-series of the synchronized local first and second PN series as detected data to the fourth means.

12. The parameter estimating apparatus according to claim 11 wherein the twentieth means comprises:

division means for dividing one of data series of the real part data and the imaginary part data detected by the third means as well as the local first and second PN series into sub-series having an equal length, means for taking out a specified sub-series of the data and a specified sub-series of the leading local PN series, decision means for calculating a correlation between the both sub-series which are taken out and determining whether or not the correlation value exceeds a first threshold value, slide means for causing said division means to restart the division of the sub-series out of the local first and second PN series by having displaced the position by one data in the PN series for which the sub-series is to be taken out by the means for taking out when the decision means determines that the correlation value does not exceed the first threshold value, sub-series update means for changing the position in the data sub-series from which the sub-series is taken out to the next sub-series and for changing the position in the local PN series from which the sub-series is taken out to the next sub-series, both to be returned to the means for taking out, when the decision means determines that the correlation value exceeds the first threshold value, and means for determining the establishment of a synchronization whenever all of the data sub-series which are taken out have correlation values which exceed the first threshold value.

13. The parameter estimating apparatus according to claim 12 wherein the sub-series update means includes:

means for cumulatively adding a correlation value when the decision means determines that such correlation value is greater than the first threshold value, and for resetting to zero the sum of the cumulative addition when the decision means determines that the correlation value is less than the first threshold value, and means for determining the establishment of a synchronization when the sum of the cumulative addition exceeds a second threshold value if the correlation values corresponding to all of the data subseries continuously exceed the threshold value and for shifting to the slide means otherwise.

14. The parameter estimating apparatus according to claim 11, further including twenty-first means which is effective during the synchronization performed by the twentieth means for detecting a phase difference of the local first and second PN series with respect to the input digital quadrature modulation signal and for determining a time alignment error from the phase difference.

15. The parameter estimating apparatus according to claim 11, further including:

means for applying a first and a second matched filtering which is based on the first PN series to a real part and an imaginary part, respectively, of the complex baseband signal, means for applying a third and a fourth matched filtering which is based on the second PN series to the real part and the imaginary part, respectively, of the complex baseband signal, means for adding a result of the first matched filtering and a result of the fourth matched filtering together, means for adding a result of the second matched filtering and a result of the third matched filtering together, means for providing a sum of respective squares or respective absolute magnitudes of added sums of the both adding means, means for providing the sum output as a time from the initiation of the measurement until a first pulse is obtained, and means for determining a time alignment error from the time.

16. The parameter estimating apparatus according to claim 11, further including switching means for validating the delay means of the third means when the input digital quadrature modulation signal is OQPSK signal and for invalidating the delay means of the third means when the input digital quadrature modulation signal is not OQPSK signal.

17. The parameter estimating apparatus according to claim 16, further including switching means for inserting or not inserting filtering means, which depends on the modulation scheme of the input digital quadrature modulation signal, between the second means on one hand and the third means and the fifth means on the other hand as well as between the fourth means and the fifth means.

* * * * *

UNITED STATES PATENT AND TRADEMARK OFFICE
CERTIFICATE OF CORRECTION

PATENT NO.:     5,946,359
DATED      :    August 31, 1999
INVENTOR(S):    Shinsuke TAJIRI, et al.

It is certified that error appears in the above-identified patent and that said Letters Patent is hereby corrected as shown below:

Col. 5, line 50, please delete the equation in its entirety and insert the following equation --$Z_1(k) = Z(k) \cdot \exp[j(\phi_1 + \Omega_1 k)]$--

Col. 7, line 5, (equation 6), line 3 of equation, change "n=k[-L/R]" to --n=[k-L/R]--

Col. 7, line 28, change "side-and" to --side and--.

Col. 8, line 25, change "$\phi^0$" to --$\phi_0$--.

Signed and Sealed this

Twenty-eighth Day of December, 1999

Attest:

Q. TODD DICKINSON

*Attesting Officer*    *Acting Commissioner of Patents and Trademarks*